United States Patent
Sugita et al.

(10) Patent No.: US 7,990,369 B2
(45) Date of Patent: Aug. 2, 2011

(54) IMAGE DISPLAY APPARATUS AND IMAGE DISPLAY MODULE

(75) Inventors: Tatsuya Sugita, Takahagi (JP); Shinichi Komura, Hitachi (JP); Shoichi Hirota, Hitachi (JP); Tsunenori Yamamoto, Hitachi (JP); Tetsuya Ooshima, Tokyo (JP); Susumu Edo, Mito (JP); Akitoyo Konno, Hitachi (JP)

(73) Assignee: Hitachi Displays, Ltd., Chiba (JP)

( * ) Notice: Subject to any disclaimer, the term of this patent is extended or adjusted under 35 U.S.C. 154(b) by 833 days.

(21) Appl. No.: 11/802,622

(22) Filed: May 24, 2007

(65) Prior Publication Data
US 2007/0222723 A1    Sep. 27, 2007

Related U.S. Application Data

(62) Division of application No. 10/634,889, filed on Aug. 6, 2003, now abandoned.

(30) Foreign Application Priority Data

Aug. 9, 2002 (JP) ................................. 2002-232317

(51) Int. Cl.
*G09G 5/00* (2006.01)
(52) U.S. Cl. .......................................... 345/204; 345/98
(58) Field of Classification Search .................. 345/204, 345/98
See application file for complete search history.

(56) References Cited

U.S. PATENT DOCUMENTS

| 4,432,610 | A | * | 2/1984 | Kobayashi et al. ............. 349/42 |
| 4,699,469 | A | | 10/1987 | Larsen |
| 4,846,557 | A | | 7/1989 | Leroux et al. |
| 4,846,559 | A | | 7/1989 | Kniffler |

(Continued)

FOREIGN PATENT DOCUMENTS

JP    56-117275 A    9/1981

(Continued)

OTHER PUBLICATIONS

Komura, Shinichi et al., "Liquid Crystal Display and Drive Method Thereof," U.S. Appl. No. 09/692,451, filed Oct. 20, 2000.

*Primary Examiner* — Richard Hjerpe
*Assistant Examiner* — Dorothy Harris
(74) *Attorney, Agent, or Firm* — Antonelli, Terry, Stout & Kraus, LLP.

(57) ABSTRACT

An image display apparatus configured by a display panel having an image memory element in a pixel, which achieves low power consumption. A nonvolatile image memory element 1, which can change the resistance value by phase change, is connected to a pixel electrode 25 of a liquid crystal element 5. The output of a thin-film transistor 17 driven by scanning and signal electrode lines 7, 9 is connected to the pixel electrode 25. When the scanning electrode line 7 is selected to have a high level voltage, the thin-film transistor 17 is turned on and a current signal flowing through the signal electrode 9 is sent through the image memory element 1 to a reference electrode line 15. Depending on the current value or pulse width passing through the image memory element 1, the resistance of the image memory element 1 is changed and is stored as a resistance value. A liquid crystal drive voltage to be applied to the liquid crystal element 5 is varied depending on the resistance of the image memory element 1 and an image is displayed on the liquid crystal element 5.

8 Claims, 15 Drawing Sheets

U.S. PATENT DOCUMENTS

| | | | |
|---|---|---|---|
| 5,296,716 A * | 3/1994 | Ovshinsky et al. | 257/3 |
| 5,471,225 A * | 11/1995 | Parks | 345/98 |
| 5,712,652 A | 1/1998 | Sato et al. | |
| 5,754,152 A | 5/1998 | Nakamura et al. | |
| 6,046,718 A * | 4/2000 | Suzuki et al. | 345/100 |
| 6,054,974 A | 4/2000 | Sakai et al. | |
| 6,147,667 A | 11/2000 | Yamazaki et al. | |
| 6,621,130 B2 * | 9/2003 | Kurokawa et al. | 257/390 |
| 6,700,813 B2 * | 3/2004 | Inui | 365/158 |
| 6,724,378 B2 * | 4/2004 | Tamura et al. | 345/204 |
| 6,753,834 B2 * | 6/2004 | Mikami et al. | 345/76 |
| 6,835,947 B2 | 12/2004 | Govyadinov et al. | |
| 7,071,485 B2 * | 7/2006 | Takaura et al. | 257/3 |
| 7,679,951 B2 * | 3/2010 | Wong et al. | 365/163 |
| 2001/0007447 A1 * | 7/2001 | Tanaka et al. | 345/87 |
| 2001/0038555 A1 * | 11/2001 | Kato | 365/185.17 |
| 2002/0021274 A1 * | 2/2002 | Koyama et al. | 345/98 |
| 2002/0021295 A1 * | 2/2002 | Koyama et al. | 345/205 |
| 2002/0024485 A1 | 2/2002 | Koyama et al. | |
| 2002/0089496 A1 * | 7/2002 | Numao | 345/204 |
| 2002/0093472 A1 * | 7/2002 | Numao | 345/87 |
| 2002/0114915 A1 | 8/2002 | Ohno et al. | |
| 2003/0103025 A1 * | 6/2003 | Kurokawa et al. | 345/87 |

FOREIGN PATENT DOCUMENTS

| | | |
|---|---|---|
| JP | 08-194205 | 7/1996 |
| JP | 2002-074741 A | 3/2002 |
| JP | 2002-149138 A | 5/2002 |

* cited by examiner

IMAGE DISPLAY APPARATUS AND IMAGE DISPLAY MODULE

CROSS-REFERENCE TO RELATED APPLICATION

This application is a Divisional application of application Ser. No. 10/634,889, filed Aug. 6, 2003, now abandoned which claims priority from Japanese patent application JP 2002-232317, filed on Aug. 9, 2002, the contents of which are incorporated herein by reference in their entirety.

BACKGROUND OF THE INVENTION

1. Field of the Invention

The present invention relates to a display apparatus and, in particular, to an image display apparatus using an image display panel with a storage means built inside for each pixel, in which the structure of the storage means is simplified, the reduction of an aperture ratio is prevented, and low power consumption is achieved. The present invention further relates to an image display module using the image display apparatus.

2. Background Art

Thin and light image display apparatuses employing various image display panels such as liquid crystal display panels, plasma display panels, or organic electroluminescence (EL) panels, are known. In the field of image display panels constituting the image display apparatus of this type, the so-called active matrix image display apparatuses are the mainstream. The active matrix image display apparatus comprises many pixels arranged in a matrix and are provided with active elements to control the on/off states of each pixel. Thin film transistors or thin film diodes are widely used as the active elements used in image display apparatuses.

Although image display apparatuses using liquid crystal display panels having thin film transistors as active elements are described hereinafter as examples of the image display panel, it is needless to say that the present invention is also applicable to other types of image display panels and to image display apparatuses using those panels. One pixel corresponds to each pixel in a monochrome display. In the case of color display, one color pixel means a unit pixel (sub-pixel) responsible for each color. However, unless particularly necessary, a unit pixel for one color pixel is described hereinafter just as a "pixel."

An example of the above active matrix image display apparatuses is known (see JP Patent Publication (Kokai) No. 8-194205 A 1996, for example). The example is provided with the so-called static semiconductor storage means (hereinafter referred to as "image memory element" or simply "memory element") for each pixel to control active elements such as thin film transistors or thin film diodes used for the on/off states of pixels, so as to reduce power consumption. JP Patent Publication (Kokai) No. 2001-306038 discloses a liquid crystal display apparatus capable of reducing power consumption. The liquid crystal display apparatus comprises a data retention means for retaining image data supplied to a plurality of pixels. A voltage is applied to the liquid crystal based on the image data retained in the data retention means. A dynamic semiconductor memory element is used for the data retention means of the LCD apparatus disclosed in the latter publication above.

However, the image memory element provided for each pixel of the image display panel constituting the conventional image display apparatus as described above is configured using semiconductor elements, or semiconductor elements and capacitors. Therefore, it requires a large number of semiconductor elements to be built into a pixel area, or a large area for accommodating capacitors. In other words, the conventional image display apparatus comprising static image memory elements requires a large number of transistors, making it difficult to manufacture the image display panel and also reducing the effective display area in the pixel region, or the aperture ratio.

Further, in the case of the image display apparatus with dynamic image memory elements, a capacitor is used to store information, so that an area is required for forming the capacitor in the pixel region. Thus, the effective area in the pixel becomes small, resulting in a reduced aperture ratio. Furthermore, in the dynamic image memory elements, the charge stored in the capacitor in accordance with stored image data decreases with time. Accordingly, periodic refreshing must be carried out to prevent changes in the stored image data. As a result, circuit configurations inside and outside the pixel become complicated, and the circuit size becomes large due to the requirement for the refreshing circuit.

In addition, since an image memory element disclosed in the above prior art is a volatile memory, in which image data disappears when the power is turned off, constant voltage application to the image memory element or data-rewriting when the power is turned on is required, which is one of the obstacles to reducing power consumption.

As described above, there have been many problems to be solved concerning image display apparatuses using conventional image display panels. A first object of the present invention is to provide an image display apparatus comprising an image display panel, which simplifies the configuration of an image memory element provided for each pixel of the image display panel to prevent the reduction of the pixel aperture ratio, and achieves low power consumption by having a configuration allowing image data to be retained inside the pixel when the power is off.

A second object of the present invention is to provide a low power consumption image display module using the above image display apparatus.

In order to achieve the above first object, according to the present invention, an image display apparatus comprises:
an image display panel having a display element comprising a plurality of pixels arranged in a matrix at crossing points where a plurality of scanning electrode lines cross a plurality of signal (display data) electrode lines;
a scanning electrode line selection circuit for selecting the scanning electrode lines of the image display panel;
a signal electrode line drive circuit for driving the signal electrode line; and
storage means for storing display data for each pixel.
The storage means comprises a resistor connected to each pixel and the display data is stored in the pixel by way of the resistance value of the resistor.

The storage means (hereinafter also referred to as "image memory element") is preferably controlled by a current signal, and furthermore, it may be nonvolatile. The image memory element uses resistance changes caused by phase changes or phase transition of a recording medium constituting the image memory element. As the phase change medium, a material that exhibits resistance due to phase changes between a crystal state and an amorphous state can be used, and a GeSbTe phase change medium is preferably used. The pixels connected to the image memory element may be electrically isolated from the scanning and the signal electrode lines. In such a case, as with the passive matrix type, rewriting means always electrically connected to the scanning and signal lines can be driven directly by the scanning and the signal electrode lines.

Further, reading means for reading data stored in the storage means may be provided. An operating means for comparing the image data (referred to as display data or display signal) read by the reading means with display data to be subsequently displayed is provided, and the read image data is thereby compared with the subsequent image data. Then, the stored data in the storage means is rewritten only when they are different. Further, a plurality of storage means can be provide in one pixel.

In order to achieve the second object, according to the present invention, the image display module comprises:
an image display panel having a display element comprising a plurality of pixels arranged in a matrix at crossing points where a plurality of scanning electrode lines cross a plurality of signal electrode lines;
a recording apparatus for recording display data in the image display panel; and
a display drive apparatus for displaying the display data recorded in the image display panel by the recording apparatus,
wherein the image display panel can be connected to one or both of the recording apparatus and the display drive apparatus.

The image display panel comprises a nonvolatile storage means for storing the display data for each pixel, a scanning line connection portion for inputting a scanning signal into the scanning line, a signal line connection portion for inputting a display data signal into the signal line, a drive line connection portion for inputting a drive signal for driving the pixel, and a power line connection portion.

In addition, the recording apparatus comprises a scanning line selection circuit, a signal line drive circuit for driving the scanning and signal lines of the liquid crystal display apparatus, a signal control circuit, and a recording apparatus connection portion for connection to the signal line connection portion and the drive line connection portion.

The recording apparatus is connected to the image display panel via the recording apparatus connection portion and the data stored in the storage means is rewritten by inputting a rewriting signal of the storage means into the scanning line and signal line connection portions.

The display drive apparatus comprises an opposite electrode drive circuit, a power circuit, and a display drive apparatus connection portion for connection to the drive line connection portion and the power line connection portion of the image display panel and the display drive apparatus is connected to the image display panel via the display drive apparatus connection portion to display the display data stored in the image display panel.

Further, each pixel of the image display panel has a plurality of image memory elements and a plurality of images are changed and displayed by switching these image memory elements.

The present invention is not limited to the above configurations and configurations of embodiments described below, and it is needless to say that various modifications are possible without deviating from the technical idea of the present invention.

This specification includes part or all of the contents as disclosed in the specification and/or drawings of Japanese Patent Application No. 2002-232317, which is a priority document of the present application.

DETAILED DESCRIPTION OF THE PREFERRED EMBODIMENTS

This application is based on the Japanese patent applications 2002-232317, filed on Aug. 9, 2002, all the contents of which is incorporated in this application by reference.

Figure 1:
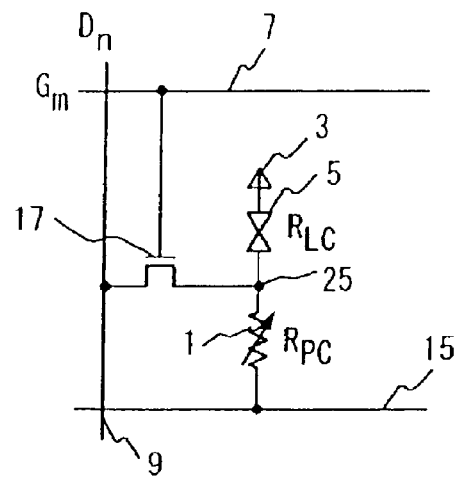
FIG. 1 is a circuit diagram showing the configuration of one pixel constituting an image display panel, namely liquid crystal display panel, of an image display apparatus according to a first embodiment of the present invention.
Figure 2:
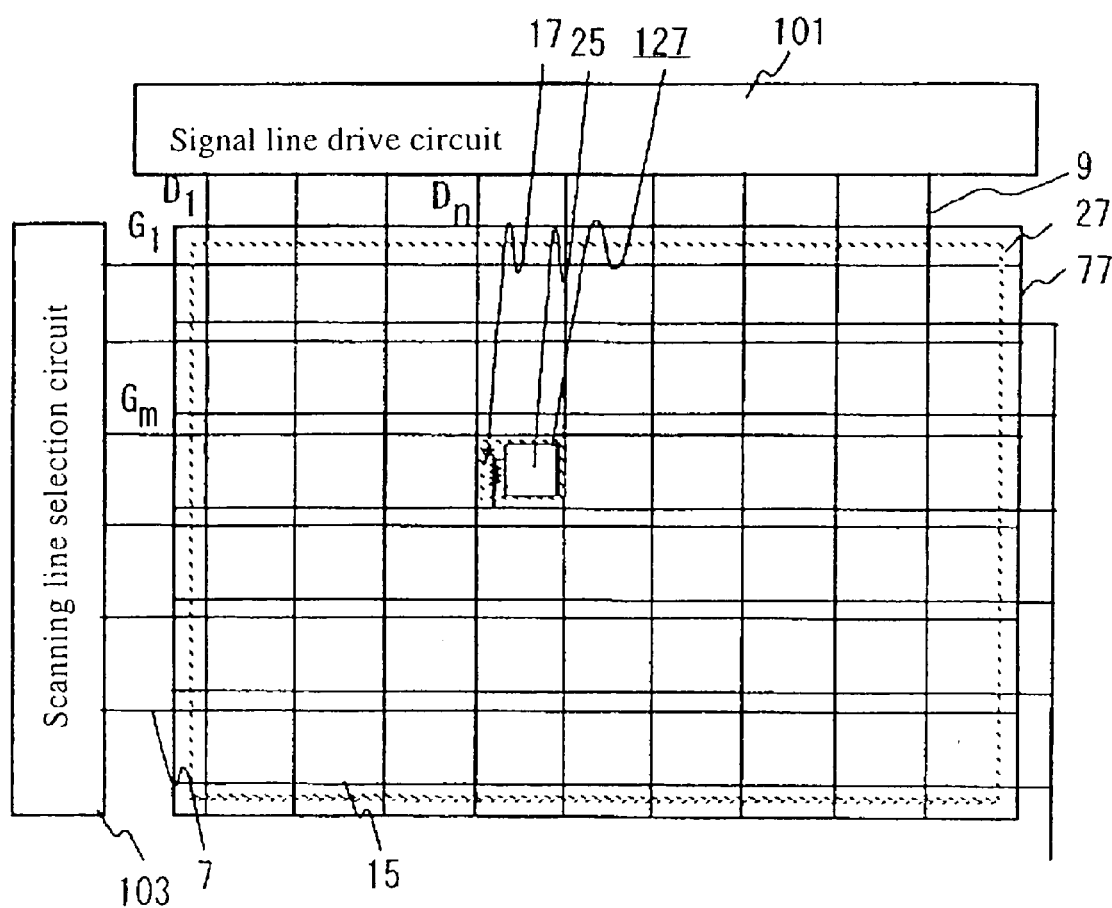
FIG. 2 is a block diagram of the image display apparatus configured by the use of the liquid crystal display panel having pixels illustrated in FIG. 1.

Hereinafter, embodiments of the present invention will be described in detail by referring to the drawings thereof. FIGS. 1 to 7 are drawings for a first embodiment of a liquid crystal display apparatus according to the present invention. A liquid crystal display panel to which the present invention is applied is used as an image display panel constituting the liquid crystal display apparatus. FIG. 1 is a circuit diagram showing the configuration of one pixel in the image display panel, namely the liquid crystal display panel, according to the first embodiment of the present invention. FIG. 2 is a block diagram of the image display apparatus configured by using the liquid crystal display panel having the pixel shown in FIG. 1.

The pixel of this embodiment shown in FIG. 1 comprises a thin-film transistor 17 (hereinafter referred to as "TFT") as a switching element, a liquid crystal element 5, and an image memory element 1, and these are enclosed by a dotted line with reference numeral 127 in FIG. 2. This pixel is arranged as pixel 127 at a crossing point of a scanning electrode line 7 and a signal electrode line 9 driven by a scanning line selection circuit 103 and a signal line drive circuit 101, respectively, in FIG. 2. Reference marks $R_{LC}$ and $R_{PC}$ represent the resistance values of the liquid crystal element 5 and the image memory element 1, respectively. The image display apparatus further includes a reference electrode line 15 for applying a voltage to the liquid crystal element 5 and causing a current to flow to the image memory element 1, a pixel electrode 25, an m-th scanning electrode line Gm, and an n-th signal electrode line Dn.

The image display apparatus shown in FIG. 2 is an active matrix type liquid crystal display apparatus, which displays images by controlling the TFT 17 provided in the pixel 127. This image display apparatus has a matrix wherein a large number of scanning electrode lines 7 cross a large number of signal electrode lines 9 in the inner face of a first substrate 77 comprising an insulating plate such as glass. The pixels 127 are arranged in a matrix at crossing points of scanning electrode lines 7 and signal electrode lines 9. Pixel electrodes 25 driven by thin-film transistors 17 of the many pixels arranged in a matrix control the orientation of liquid crystal elements 5 using the electric field generated between the pixel electrodes 25 and opposite electrodes 3 formed on the inner face of a second substrate (not shown) preferably formed of glass, for example.

Each pixel 127 includes the image memory element 1 shown in FIG. 1 and retains image data (display data) displayed in the pixel 127. This image memory element 1 reversibly changes its resistance to record image data, and also can rewrite the recorded image data. In its ordinary use, it is used as nonvolatile memory wherein recorded image data is not erasable.

The image memory element 1 is switched by pulse current from the signal electrode line 9. The resistance state for switching is controlled by changing the current value and pulse width of the pulse current. In FIG. 2, an uppermost scanning electrode line 7 is numbered as $G_1$ and the rest of the scanning electrode lines are sequentially numbered. A leftmost signal electrode line 9 is numbered as $D_1$ and the rest of the signal electrode lines are sequentially numbered. In this case, the pixel circuit at a crossing point of $G_m$-th scanning electrode line 7 and $D_n$-th signal electrode line 9 is shown in FIG. 1. When $G_m$-th scanning electrode line 7 is selected to have a high level, an n-type TFT 17, the gate of which is connected to the scanning electrode line 7, is turned on. At the same time a current signal (namely image data) passing through the signal electrode line 9 at the same time is captured in the TFT 17 and it passes through the image memory element 1, flowing to the reference electrode line 15. In response to the current value or pulse width of the current passing through the image memory element 1, the resistance value of the image memory element 1 varies, and the resistance value is stored as image data.

In this embodiment, a pixel electrode 25 (indicated as a connection point between the liquid crystal element 5 and the TFT in the figure) of the liquid crystal element 5 is connected to the reference electrode line 15 via the image memory element 1. Thus, the drive voltage applied across the opposite electrode 27 of the liquid crystal element 5 and the reference electrode line 15 is applied to the image memory element 1 and the liquid crystal element 5 connected in series. Therefore, a voltage determined by the ratio at the resistance $R_{LC}$ of the liquid crystal element 5 to the resistance $R_{PC}$ of the image memory element 1 is applied to the liquid crystal element 5 as an effective liquid crystal drive voltage. When the resistance $R_{PC}$ of the image memory element 1 is changed by switching, in response to it, the liquid crystal drive voltage changes in response so that the display state of the liquid crystal element 5 is switched.

Figure 3:
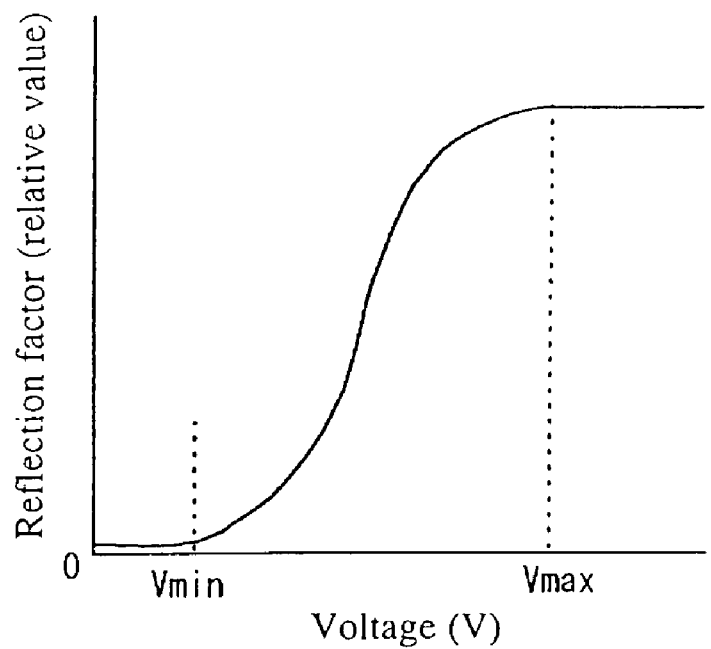
FIG. 3 is an explanatory view showing the voltage-reflection factor characteristics of a liquid crystal element in a normally closed mode used for the liquid crystal display panel of the first embodiment of the present invention.

FIG. 3 describes the voltage-reflection factor characteristics of the liquid crystal element in a normally closed mode used for the liquid crystal panel of the first embodiment of the present invention. The reflection factor is represented by relative value. When the drive voltage across the opposite electrode 3 and the reference electrode line 15 is V, a threshold voltage at which the liquid crystal element 5 is closed is $V_{min}$, a threshold voltage for an open state is $V_{max}$, the resistance when the image memory element 1 is in a high resistance state is RH, and the resistance when it is in a low resistance state is RL, the following relationships are satisfied:

$$V_{min} \geq R_{LC}V/(R_{LC}+RH)$$

$$V_{max} \leq R_{LC}V/(R_{LC}+RL)$$

so that the display state of the liquid crystal element 5 can be switched using the resistance changes of the image memory element 1. Further, $R_{LC} \geq RH$ is desired. In other words, when $R_{LC}$ is equal to or larger than RH, the current applied from TFT 17 passes mainly through the image memory element 1 and the current can be effectively used for switching of the image memory element 1. The threshold voltages should be satisfied likewise in the normally open mode.

Figure 4:
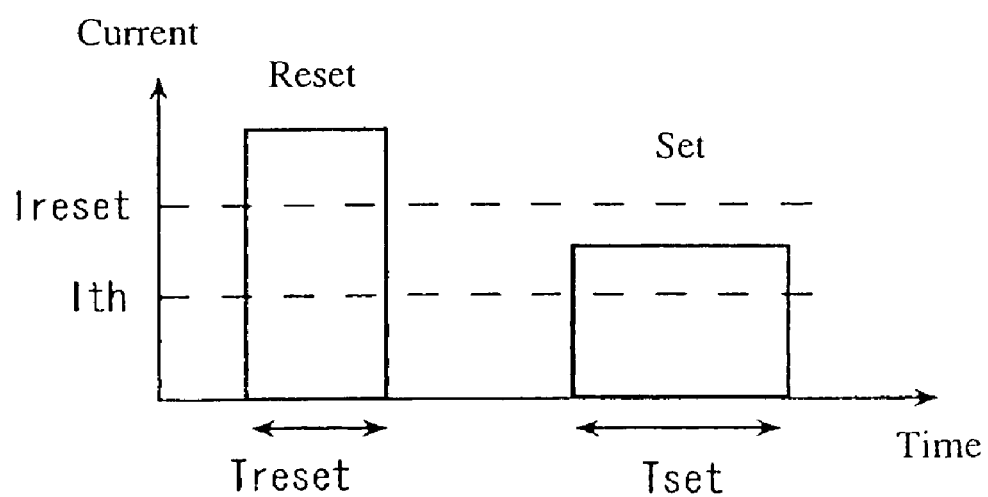
FIG. 4 is a waveform chart of a current pulse for switching the image memory element used in the first embodiment of the present invention.

FIG. 4 is a waveform chart of the current pulse for switching the image memory element 1 used in the first embodiment of the present invention. In this embodiment, a thin film of phase change medium (phase change film) that is reversibly changeable between two phases, that is a crystal phase and an amorphous phase, is used as the recording medium of the image memory element 1. The crystal state of the phase change medium differs in resistance from the amorphous state thereof. Generally, when the medium is in the crystal state (referred to also as "crystal phase"), the resistance is low, and is in the amorphous state (referred to also as "amorphous phase"), the resistance is high. Phase change may be caused by heating this memory medium.

In this embodiment, the memory medium constituting an image memory element is heated using Joule's heat generated by the flow of an electric current so that phase change is caused. When the image memory medium comprising a phase change film is changed to an amorphous phase (hereinafter, this is referred to as "reset operation"), a current of not less than $I_{reset}$ of FIG. 4 is allowed to flow to melt the phase change film. The period $T_{reset}$ during which the current flows is set to be not shorter than the time period required for heating the phase change film to melting point or higher, and not longer than the period during which the molten phase change film rapidly cools to become amorphous. The molten phase change film thereby becomes amorphous. On the other hand, when the film is crystallized (hereinafter, this is referred to as "set operation"), a current of not less than $I_{th}$ and less than $I_{reset}$ is allowed to flow for a sufficient period $T_{set}$ for crystallizing the phase change film so that the film is annealed and crystallized.

In this way, when a phase change from crystal phase to amorphous phase is caused (reset operation), a current of not greater than $I_{reset}$ is allowed to flow for a short period to melt the phase change medium, which is then rapidly cooled. When phase change from amorphous phase to crystal phase is caused (set operation), a current of from $I_{th}$ to $I_{reset}$ is allowed to flow for a longer period so that the medium is kept at a crystallization temperature or higher to be crystallized. Regardless of the state before phase change, the previous phase state can be erased by causing the current having the same pulse waveform to flow, so that the phase change film can be rewritten to a new phase state. Chalcogenide materials such as GeSbTe, InSbTe, and AgInSbTe are preferably used, as materials of the phase change medium. In this embodiment, the composition comprising $GeSb_2Te_4$, $In_2SbTe_3$, and $Ag_5In_5Sb_{70}Te_{20}$ is employed.

In the phase change medium, phase change occurs with a current pulse of not greater than 50 ns, and therefore switching (between crystal phase and amorphous phase) can be conducted at a high speed. In this embodiment, $T_{reset}$ is from 30 to 50 ns and $T_{set}$ is from 50 to 100 ns. When the composition of the phase change medium is changed, the phase change speed can be reduced, thereby enabling the adjustment of phase change speed in accordance with the drive performance of the drive circuit. When $GeSb_2Te_4$ is used, there is a difference of 100 to 1,000 times in the resistance between the crystal state and the amorphous state.

Further, GeSbTe materials are excellent for repeated rewriting. InSbTe materials have a feature that the resistance ratio between the crystal phase and amorphous phase is high. Accordingly, it is preferable to select a suitable material depending on the characteristics of the image display apparatus. These materials have a substantially higher glass transition temperature than room temperature and each phase state can be maintained for a long time so as to function as a nonvolatile memory. In addition to chalcogenides, materials such as $VO_2$ that show metal-insulator transition depending on temperature may be used. Further, materials that show metal-insulator transition in accordance with structural phase transition may also be used.

Figure 5:
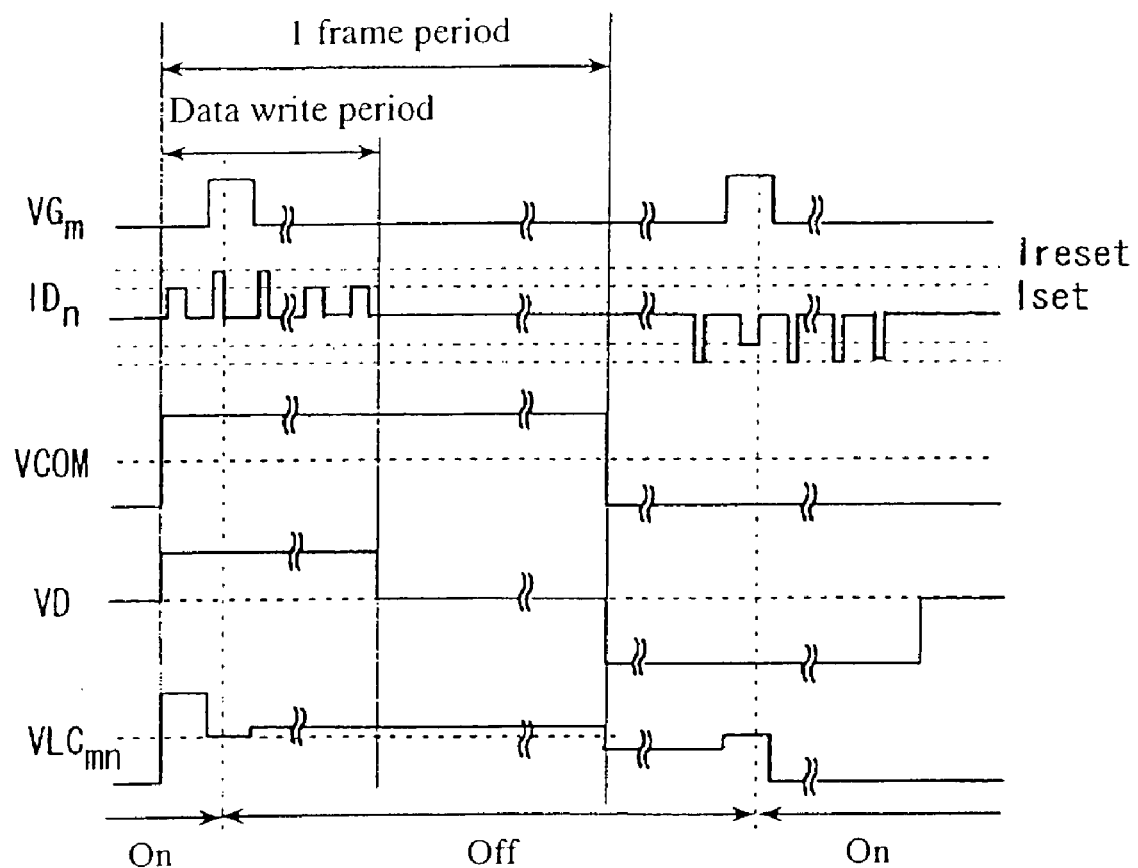
FIG. 5 is an explanatory view showing signal waveforms for driving the image display panel.

FIG. 5 shows signal waveforms for driving the image display panel. Voltage VGm of the scanning electrode line 7 shown in FIG. 2 is selected once every one frame cycle by the scanning line selection circuit 103 to have a high level. An image data signal is supplied to the signal electrode line 9 from the signal line drive circuit 101. In this embodiment, a current signal for rewriting the image memory element 1 is supplied as an image data signal. In a pixel formed at a crossing point of m-th scanning electrode line 7 and n-th signal electrode line 9, when the voltage VGm of m-th scanning electrode line 7 becomes high, TFT 17 is turned on and conducts. Therefore, the current IDn that has flown through the signal electrode line 9 at that time flows through TFT 17 to be supplied to the image memory element 1.

As described in FIG. 4, when the medium is phase-changed from crystal phase to amorphous phase (reset operation), a current of not greater than $I_{reset}$ is allowed to flow for a short period. When the medium is phase-changed from amorphous phase to crystal phase (set operation), a current of $I_{th}$ to $I_{reset}$ is allowed to flow for a longer period. The selection period for one scanning line is about 16 μs for an ordinary frame cycle of about 60 Hz with 1,000 scanning lines, and it is sufficiently longer compared with the period for rewriting the image memory element 1. In this embodiment, when the image memory element 1 is reset, the liquid crystal element 5 is turned off. When the image memory element 1 is set, the liquid crystal element 5 is turned on. In accordance with changes of the image memory element 1, the display of the liquid crystal element 5 is changed. Drive voltage VCOM for driving the liquid crystal element 5 is applied to the opposite electrode 3.

In this embodiment, the drive voltage VCOM employed an ac voltage such that the polarity is reversed at frame intervals. Thus, the potential difference between the signal electrode line 9 and the opposite electrode 3 can be reduced by reversing the polarity of base voltage VLCmn of the signal electrode line 9 in the same manner as the drive voltage VCOM, thereby reducing the current flowing through the liquid crystal element 5 and causing almost all the current to pass through the image memory element 1. The polarity of signal current IDn is also reversed in line with the reversal of the drive voltage VCOM.

In this embodiment, the pixels have a nonvolatile memory therein as an image memory element. Therefore, once image data is written in the image memory element 1, it is not necessary to write in image data until the display image is changed. In the case of an image display panel (image display apparatus), which retains image data using a conventional capacitor, it is necessary to refresh data at regular time intervals even when a still image is displayed. In this embodiment, refreshing is not required. Therefore, when information such as text (characters) and still images is displayed, only the supply of liquid crystal drive voltage is necessary until the displayed image is changed. Further, since a nonvolatile memory is used, flicker caused by alternating liquid crystal drive voltage does not occur and the drive frequency of liquid crystal drive voltage can be delayed to such extent that the liquid crystal does not deteriorate. Thus, the power consumption caused by charging/discharging to liquid crystal capacitance due to liquid crystal drive or by charging/discharging to stray capacitance of wiring can be largely reduced, thereby resulting in low power consumption.

Furthermore, in order to switch still image display using image memory and moving image display using no image memory element, it is preferable that one frame period is integral multiple of image data writing period. The reason therefor is that moving image display and still image display can be switched using a clock in line with the frequency for moving image display. In addition, when displaying a moving image, it is not necessary to retain data since data is rewritten at high speed, and thus one frame period may be equal to data writing period. Further, since it is not necessary to store image data when displaying a moving image, a switch for separating an image memory element from a pixel may be provided so as not to use the image memory element 1. The number of times of rewriting of an image memory element can be thereby reduced to enhance the reliability of the image memory element.

During the image data writing period, the opposite electrode 3 may be caused to have a high impedance so as to prevent the current flow to the liquid crystal element 5. In this case, it is not necessary to apply alternating voltage to the signal electrode line 9 or to reverse the current. Further, an alternating current for driving the liquid crystal may be supplied to the reference electrode line 15. Alternatively, an alternating current may be supplied to both the opposite electrode 3 and the reference electrode line 15.

Figure 6:
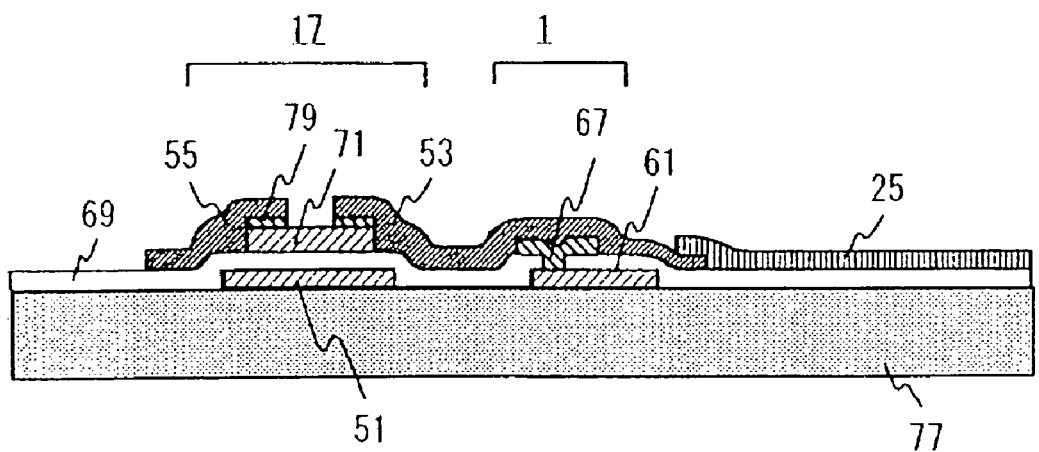
FIG. 6 is a cross-sectional view of a substantial part of a first substrate constituting the liquid crystal display panel of the first embodiment of the present invention.

FIG. 6 is a cross-sectional view of a substantial part of a first substrate constituting the liquid crystal display panel according to the first embodiment of the present invention. In the figure, there are shown a glass substrate 77, a gate electrode 51, an insulating film (gate insulating film) 69, a silicon film 71, an N+ silicon film 79, a source electrode 53, a drain electrode 55, a memory element electrode 61, a phase change film 67, and a pixel electrode 25. Reference numerals 1 and 17 denote an image memory element and a thin film transistor in the same manner as these of FIG. 1.

In this embodiment, the silicon film 71 is made from amorphous silicon (a-Si) to constitute a TFT. The gate electrode 51 and the image memory element electrode 61 are formed on the glass substrate 77. The image memory element electrode 61 in contact with the phase change film 67 preferably has high heat resistance. The gate electrode 51 and image memory element electrode 61 can be simultaneously formed with identical material, using a metal with a high melting point such as tantalum (Ta), molybdenum-tantalum (MoTa), molybdenum-tungsten (MoW), tungsten (W), or molybdenum (Mo), which are frequently used as materials for the gate electrode 51 of TFT. The insulating film 69 is formed on the gate electrode 51 of the TFT 17 and the image memory element electrode 61 using silicon oxide (SiOx) or silicon nitride (SiNx).

A contact hole is formed in the insulating film 69, and the phase change film 67 is formed so as to be in contact with the image memory element electrode 61. An amorphous silicon film 71 is also formed on the insulating film 69 directly on the gate electrode 51 of TFT 17. On top of this, the N+ silicon layer 79 is formed, and the source electrode 53 and drain electrode 55 of TFT 17 are formed with a metal such as aluminum.

The source electrode 53 covers the phase change film 67 as a part of the electrode of the image memory element 1. Further, the source electrode 53 is connected to the pixel electrode 25. A channel part of TFT 17 is formed so as to separate the source electrode 53 from the drain electrode 55, thereby forming TFT 17. On top of that, a protective film (not shown) is formed. When a transparent electrode is used for pixel electrode 25, a transmission image display panel can be formed. When a metal film such as aluminum is used for pixel electrode 25, a reflection image display panel can be formed. In the case of a reflection image display panel, the pixel electrode 25 and the TFT 17/image memory element electrode 61 are separated above and below so that the pixel electrode 25 may be formed to cover the TFT 17 and the image memory element electrode 61. In this case, the aperture ratio can be made large.

The phase change film 67 is heated by the flow of a current signal from the source electrode 53 of TFT and the image memory element electrode 61. The width of the phase change film 67 is narrow at the side of the image memory element electrode 61, where current concentration occurs, thereby increasing the calorific value. Therefore, the phase change film 67 has high temperature at the side of the image memory element electrode 61 and melts easily. Accordingly, it is preferable that the image memory element electrode 61 has higher melting point than the phase change film 67. In addition, the heat generated at the phase change film 67 is well released toward the side of source electrode 53 with high heat conductivity, and rapidly cooled down when the current is turned off. Silicides such as tantalum silicide ($TaSi_2$) may be used for image memory element electrode 61.

TFT 17 is not limited to one made of amorphous silicon of this embodiment, but polysilicon (p-Si) or single crystal silicon may be used for manufacturing the same. In addition to the reverse-staggered type as shown in this embodiment, other types of TFT structures such as the normal-stagger type and the coplanar type may be employed.

The resistance value RH of the phase change film in a high resistance state is preferably as high as the resistance $R_{LC}$ of the liquid crystal element 5. On the other hand, the voltage to cause electric current to pass through the image memory element 1 is preferably low. To this end, it is preferable that the cross-sectional area of the phase change film 67 is reduced while maintaining the film thickness thereof to increase the resistance value RH.

Figure 7:
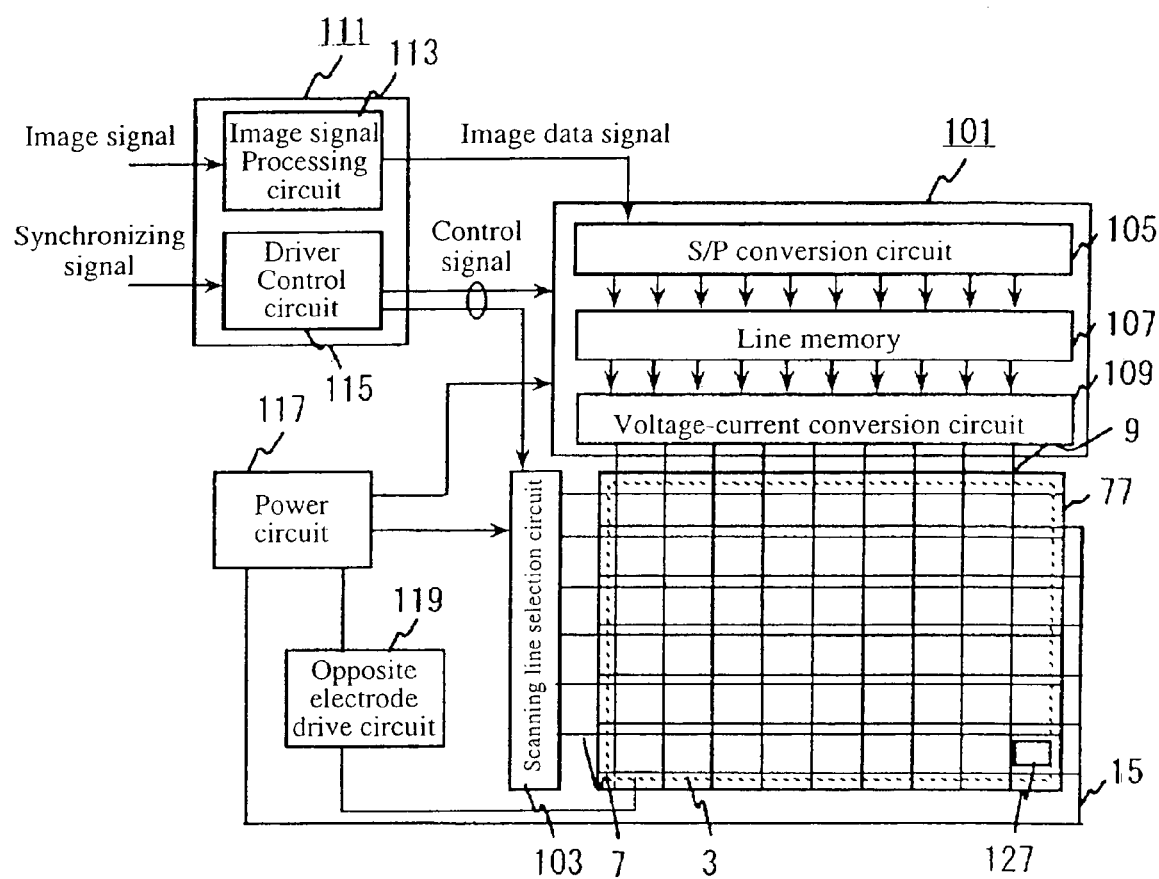
FIG. 7 is a block diagram showing the configuration of the image display apparatus according to the first embodiment of the present invention.

FIG. 7 is a block diagram showing the configuration of the image display apparatus according to the first embodiment of the present invention. In the figure, a signal line control circuit 101 comprises a serial-parallel (S/P) conversion circuit 105, a line memory 107, and a voltage-current conversion circuit 109. Further, a signal control circuit 111 comprises an image signal processing circuit 113 and a drive control circuit 115. The image signal processing circuit 113 converts an image signal inputted from an external signal source (not shown) to an image data signal having a format displayable on a liquid crystal display panel. The driver control circuit 115 generates a control signal for the signal line control circuit 101 and the scanning line selection circuit 103 based on synchronizing signals.

The signal control circuit 111, upon reception of the image signal and the synchronizing signal from the external signal source, sends image data from the image signal processing circuit 113 to the signal line control circuit 101 and outputs control signals from the driver control circuit 115. In the serial/parallel signal conversion circuit 105 of signal control circuit 101, the image data signals transmitted as serial signals are converted into the same number of parallel signals as the number of signal electrode lines 9, and image data corresponding to one scanning line is stored in the line memory 107. The image data stored in the line memory 107 is sent to the voltage-current conversion circuit 109 where the voltage data is converted to current values, which are then outputted in step with the control signal timing.

The scanning line selection circuit 103 selects a scanning electrode line 7 in synchronization with the control signal to enable it to have a high level, and scans sequentially selected scanning electrode lines 7. A power source circuit 117 generates reference voltage of data signals and required voltages to be applied to the scanning electrode line 7 and opposite electrode 3, and further alternates voltage to be applied to the opposite electrode 3 with an opposite electrode drive circuit 119, thereby applying the voltage to the opposite electrode 3.

A nonvolatile memory using the above-described phase change medium is characterized in that rewriting can be performed at high speed and with low voltage and low power consumption compared with conventional nonvolatile memories such as flash memories. Further, it is capable of a large number of rewritings, and therefore its service life is 10 years or more even when rewriting is performed at 60 Hz. This is a sufficient service life for displaying moving images. Furthermore, a memory of this type is characterized in that its cell area is small and the reduction of the aperture ratio of the image display panel is small even when a memory element is mounted thereon. The use of this memory as memory element in a pixel of image display panel (image display apparatus) enables low power consumption, a high aperture ratio, and longer service life. Additionally, since the memory element can be made small, it is suitable for a high definition image display apparatus. In that case, it is possible to display high-quality color image data in binary display by using area gradation.

Heretofore, embodiments of the present invention using liquid crystal have been described concerning a liquid crystal display panel using an opposite electrode and a liquid crystal display apparatus using a liquid crystal display panel. However, the liquid crystal display panel, liquid crystal display apparatus, and display mode or element structure to be used for the present invention are not particularly limited. For example, the present invention can be applied to an image display apparatus using an in-plane switching liquid crystal display panel in the same manner. As for display mode, TN (Twisted Nematic) liquid crystal, guest host liquid crystal, PDLC liquid crystal, etc. may be usable. Further, cholesteric liquid crystal with bistability can store display, so that the display can be retained even after liquid crystal drive voltage is turned off. When this bistable cholesteric liquid crystal is used, an image memory element does not necessarily have to be nonvolatile, and an element that reversibly changes resistance may be used. Further, if the properties of the memory medium change when exposed to light, it is preferable to shield the memory medium from light.

Figure 8:
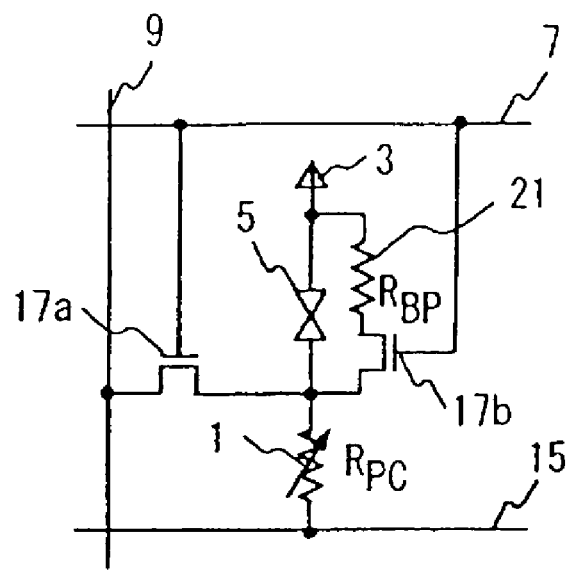
FIG. 8 is a circuit diagram showing the configuration of one pixel of an image display panel (liquid crystal display panel) according to a second embodiment of the present invention.

Next, a second embodiment of the present invention will be described using FIG. 8. FIG. 8 is a circuit diagram showing the configuration of one pixel of a liquid crystal display panel according to the second embodiment of the present invention. The figure shows a first TFT 17a, a second TFT 17b, and a by-pass resistor 21, whose resistance value is indicated by $R_{BP}$. In FIGS. 1 and 8, like reference marks refer to like functional portions. When a scanning electrode line 7 is selected and has a high level, the first and second TFTs 17a and 17b conduct. Therefore, current data signals flowing in the signal electrode line 9 pass through the first TFT 17a to the image memory element 1, causing the image memory element 1 to be switched into a memory state in accordance with the current data.

The resistance of the image memory element 1 at high resistance state, resistance of the by-pass resistor 21, and resistance of the liquid crystal element 5 are referred to as RH, $R_{BP}$, and $R_{LC}$, respectively.

The current data signal introduced from the first TFT 17a passes mainly through the image memory element 1 and can be effectively used for switching of the image memory element 1 if the relationship $RH<R_{BP}<R_{LC}$ is satisfied, where RH is the resistance of the image memory element 1 at high resistance state, $R_{BP}$ is the resistance of the by-pass resistor 21, and $R_{LC}$ is the resistance of the liquid crystal element 5. Further, since the second TFT 17b also conducts at this time, a small amount of current flowing at the side of the liquid crystal element 5 passes through the by-pass resistor 21 and almost no current thereby passes through the liquid crystal element 5.

When the scanning electrode line 7 has a low level, the first and second TFTs 17a, 17b are both turned off. Then, a voltage determined by the division of the voltage across the reference electrode line 15 and the opposite electrode (not shown) by the resistance $R_{LC}$ of the liquid crystal element 5 and the resistance $R_{PC}$ of the image memory element 1 is applied to the liquid crystal element 5. Thus, the display of the liquid crystal display element 5 can be switched in response to the resistance of the image memory element 1. This embodiment produces the same effect as the above embodiment, thereby making it possible to display high-quality color image data.

Figure 9:
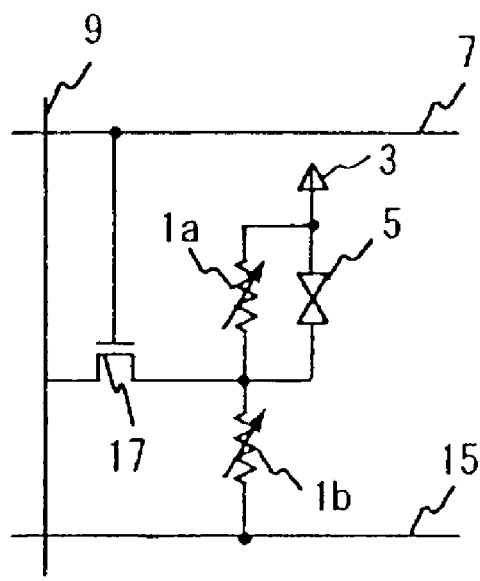
FIG. 9 is a circuit diagram showing the configuration of one pixel of an image display panel (liquid crystal display panel) according to a third embodiment of the present invention.

FIG. 9 is a circuit diagram showing the configuration of one pixel of the image display panel (liquid crystal display panel) according to a third embodiment of the present invention. In the figure, there are shown a first image memory element 1a and a second image memory element 1b. In FIGS. 1 and 8, like reference numerals refer to like elements. In FIG. 9, when a scanning electrode line 7 is selected and has a high level, the TFT 17 conducts. A current data signal flowing in the signal electrode line 9 passes through TFT 17 to the first image memory element 1a or second memory element 1b to switch the memory state according to the current data. By controlling the voltage of the signal electrode line 9, the image memory elements 1a or 1b can be selected to which the current flows. The resistance of the first and second memory elements 1a, 1b can be independently controlled by sequentially rewriting the first and second image memory elements 1a, 1b.

When the scanning electrode line 7 has a low level, the TFT 17 is turned off. Then, a voltage determined by the division of the voltage across the reference electrode line 15 and the opposite electrode (not shown) by the first and second image memory elements 1a, 1b is applied to the liquid crystal element 5. Thus, the display of the liquid crystal element 5 can be switched by resistance change of the image memory element 1. Namely, when the first and second image memory elements 1a, 1b have the same resistance, the following three values of voltage can be generated in accordance with the combination of resistances.

$$VH=V \cdot RH/(RH+RL) \approx V$$

$$VL=V \cdot RL/(RH+RL) \approx 0$$

$$VM=V \cdot RH/(RH+RH) \approx V/2$$

Therefore, the liquid crystal element 5 can display half tone in addition to on- and off-states.

In this embodiment, since a voltage to be applied to the liquid crystal element 5 is not dependent on the resistance thereof, stable image quality can be obtained without the influence of secular changes in resistance of liquid crystal element 5, resistance variations of liquid crystal material, or the like. Further, liquid crystal drive voltage can be efficiently applied to the liquid crystal element 5. Voltage VL is nearly zero, and the on-off ratio of voltage to be applied to liquid crystal is suitable. In addition to the above effects, this embodiment produces the same effects as the above embodiments, thereby making it possible to display high-quality color image data.

Figure 10:
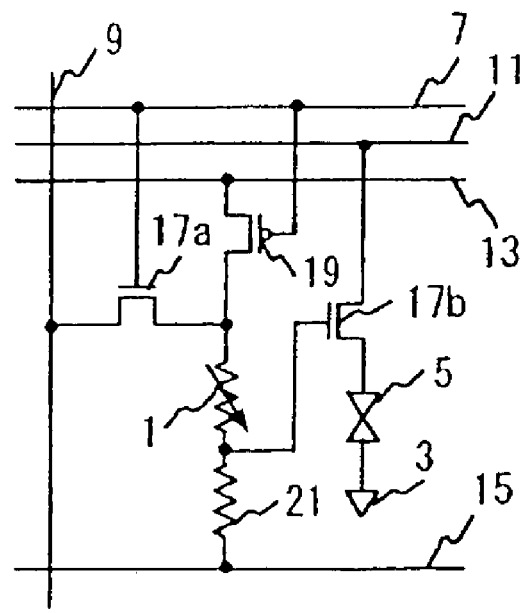
FIG. 10 is a circuit diagram showing the configuration of one pixel of an image display panel (liquid crystal display panel) according to a fourth embodiment of the present invention.

FIG. 10 is a circuit diagram showing the configuration of one pixel of liquid crystal display panel according to a fourth embodiment of the present invention. The figure shows a p-type TFT 19, a resistor 21, a power electrode line 13, and a drive voltage supply electrode 11. Like reference numerals refer to like functional portions in this figure and the figures of the above embodiments. In FIG. 10, when a scanning electrode line 7 is selected and has a high level, the first TFT 17a conducts and the p-type TFT 19 is turned off. Current data signals flowing in the signal electrode line 9 pass through the first TFT 17a and flows into the image memory element 1 and the resistor 21. The image memory element 1 is switched into a memory state in accordance with the passed current data.

When the scanning electrode line 7 has a low level, the first TFT 17a is interrupted and the p-type TFT 19 conducts. Thus, DC voltage between the power electrode line 13 and the reference electrode line 15 is applied across the image memory element 1 and the resistor 21. A voltage determined by the division of the voltage by the image memory element 1 and the resistor 21 is applied to the gate of the second TFT 17b, and the gate voltage of the second TFT 17b is changed depending on the resistance value of the image memory element 1. On-off control of the second TFT 17b can be performed in accordance with the resistance value of memory element 1 by defining the resistance value of the resistor 21 so that the second TFT 17b is turned on or off in response to these voltage changes.

In other words, when the image memory element 1 has high resistance, the gate voltage becomes low and thus the second TFT 17b is off. Conversely, when the image memory element 1 has low resistance, the gate voltage becomes high and thus the second TFT 17b is turned on. When the second TFT 17b is turned on, voltage of the drive voltage supply electrode 11 is applied to the liquid crystal element 5, and when the second TFT 17b is turned off drive voltage is not applied. Therefore, on-off control of the liquid crystal element 5 is performed with the resistance of the image memory element 1.

In this embodiment, since voltage to be applied to the liquid crystal element 5 is switched using the second TFT 17b, the liquid crystal element 5 can be thoroughly switched on or off. Further, because the resistance of the image memory element 1 may be changed within such range to control the gate of the second TFT 17b, there is almost no influence on image quality due to variations of the resistance of the image memory element 1, and characteristic (property) changes caused by repeated operations, thereby providing stable image quality. Furthermore, in this embodiment, the p-type TFT 19 is controlled using the scanning electrode line 7, but an n-type TFT may be used instead of p-type TFT 19 and a signal line to control this n-type TFT is separately provided. The circuit may be thereby constituted using only an n-type TFT.

Figure 11:
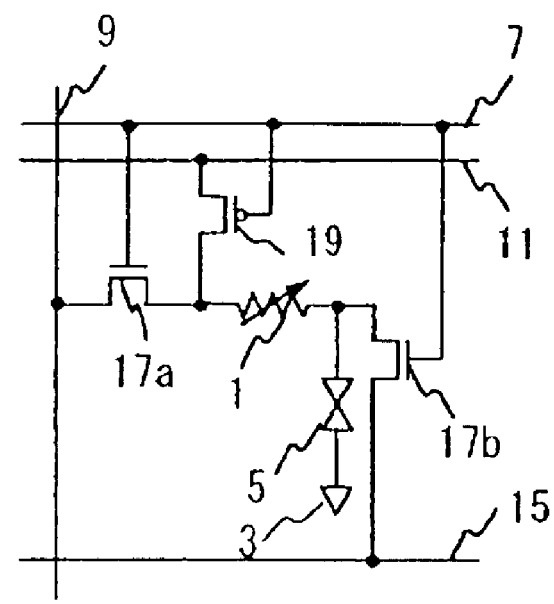
FIG. 11 is a circuit diagram showing the configuration of one pixel of an image display panel (liquid crystal display panel) according to a fifth embodiment of the present invention.

FIG. 11 is a circuit diagram showing the configuration of one pixel of an image display panel (liquid crystal display panel) according to a fifth embodiment of the present invention. In this figure and the above embodiments, like reference numerals refer to like elements. In FIG. 11, when the scanning electrode line 7 is selected and has a high level, first and second TFTs 17a, 17b are turned on and a p-type TFT 19 is turned off. The current data signal flowing in the signal electrode line 9 passes through the first TFT 17a and flows to the second TFT 17b via the image memory element 1. The image memory element 1 is thus switched to a memory state corresponding to the current data. Since this current flows from the image memory element 1 through the second TFT 17b to the reference electrode line 15, the current does not flow through the liquid crystal element 5.

When the scanning electrode line 7 has a low level, the first and second TFTs 17a and 17b are turned off and the p-type TFT 19 is turned on. As a result, the drive voltage from the drive voltage supply electrode 11 is applied through the p-type TFT 19 to the image memory element 1 and liquid crystal element 5, and a voltage corresponding to the memory state of the image memory element 1 is applied to the liquid crystal element 5 to provide pixel display.

The liquid crystal element 5 usually has high resistance and the current flowing through it is small. Thus, according to this embodiment, power consumption of the liquid crystal element 5 and image memory element 1 at the time of displaying images is low, and much lower power consumption can be achieved. Further, since the resistance of the image memory element 1 can be continuously changed by controlling the current value flowing through the image memory element 1 within the range from $I_{reset}$ to $I_{th}$, it is possible to perform gradation display on the liquid crystal element 5.

In addition, since the current for switching the image memory element 1 is a short-period pulse, the second TFT 17b may not be provided when current is allowed to flow to the reference electrode line 15 through the capacitance of the liquid crystal element 5. Namely, when the resistance of the liquid crystal pixel is larger than that of the phase change memory (image memory element 1) and may be negligible, the impedances of the image memory element 1 and liquid crystal element 5 are determined by resistance $R_{PC}$ of the image memory element 1 and the capacitance C of the liquid crystal element 5, and they are expressed relative to frequency f by the following formula.

$$\sqrt{\{R_{PC} + (1/2\pi fc)^2\}}$$

Therefore, when $R_{PC}$ is nearly equal to or larger than $(1/2\pi fC)$ current is allowed to flow through the capacitance of the liquid crystal element 5.

A single pulse with a pulse width T to be applied to the image memory element 1 can be calculated by the equation $f=1/2T$. Therefore, a pulse with a pulse width of 100 ns corresponds to 5 MHz. Namely, it is preferable that a pulse width be short as in the phase change medium of this embodiment because in that way, the current can be easily caused to flow through the liquid crystal capacitance. When a current passes through the capacitance of the liquid crystal element 5, heating does not occur due to the resistance of the liquid crystal element, thereby suppressing the deterioration of liquid crystal.

Figure 12:
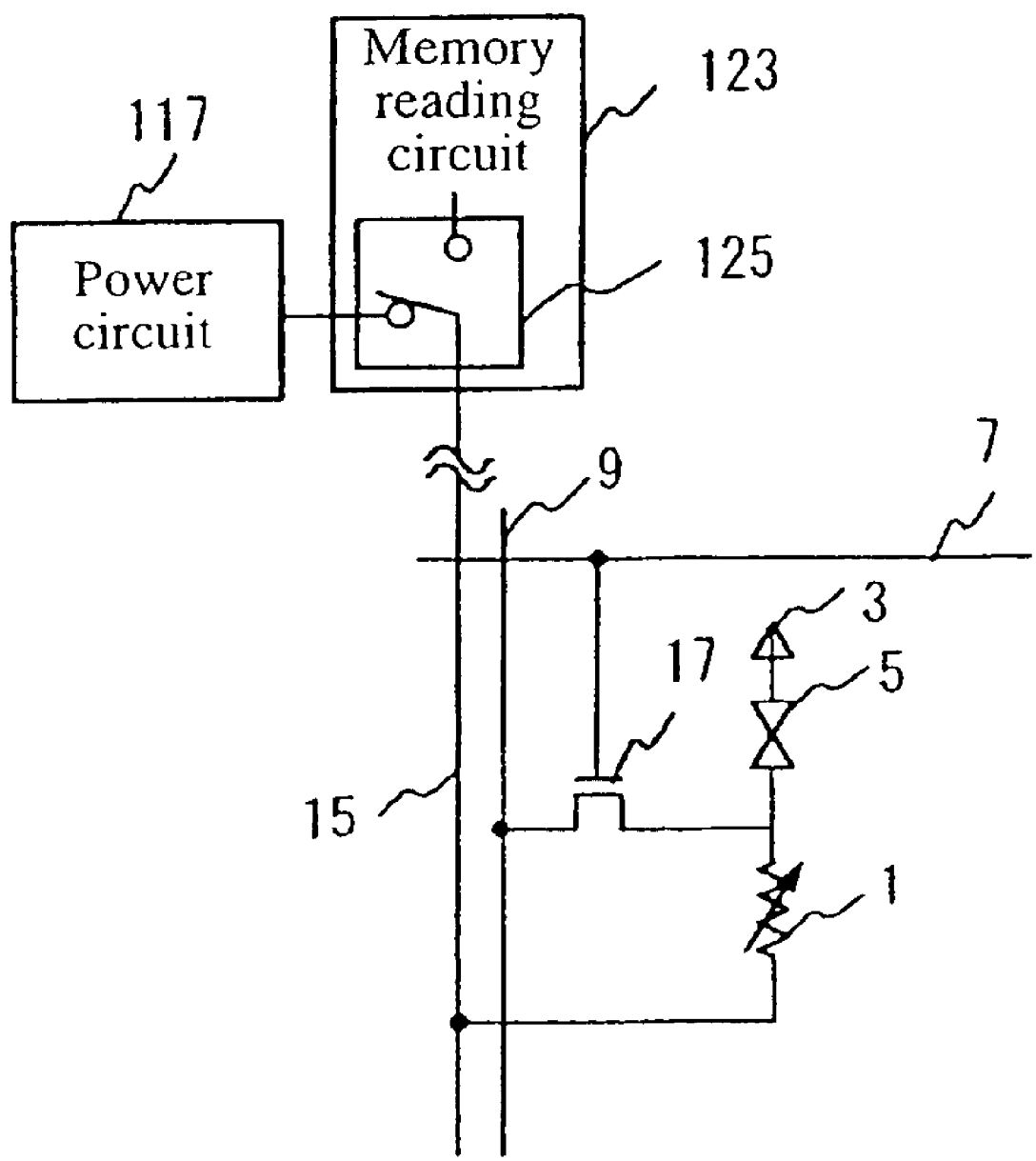
FIG. 12 is a circuit diagram showing the configuration of one pixel of an image display panel (liquid crystal display panel) according to a sixth embodiment of the present invention.

FIG. 12 is a circuit diagram showing the configuration of one pixel of an image display panel (liquid crystal display panel) according to a sixth embodiment of the present invention. In this embodiment, in addition to the rewriting circuit for the image memory element 1, a memory reading circuit 123 for reading the state of the image memory element is provided. The memory reading circuit 123 has a switch 125. First, display operation of image display apparatus will be described. In the case of displaying, the switch 125 is changed over to power source circuit 117 to connect the reference electrode line 15 to the power source circuit 117. Then, when the scanning electrode line 7 is selected and has a high level, the TFT 17 is turned on. A current data signal flowing in the signal electrode line 9 passes through the TFT 17 to the image memory element 1 to switch its memory state according to the current data.

When the scanning electrode line 7 has a low level, the TFT 17 is turned off. Then, drive voltage between the reference electrode line 15 and the opposite electrode 3 is applied across the liquid crystal element 5 and the image memory element 1, and thereby displaying on the liquid crystal element 5 is performed in accordance with the resistance of the image memory element 1. Next, in the case of reading operation of the image memory element, the switch 125 is changed over so as to connect the reference electrode 15 to the memory reading circuit 123. A read current of not greater than $I_{th}$ is applied to the signal electrode line 9. When the scanning electrode line 7 has a high level, a current passes through the TFT 17 to the image memory element 1. The voltage of the drive voltage supply electrode 11 shown in FIG. 11 is monitored by the memory reading circuit 123, and the state of the image memory element 1 can be thereby read out. Even when a reading operation is performed, the resistance value of the image memory element 1 is not changed by making this read current substantially lower than $I_{th}$, and the reading can be performed any number of times.

Figure 13:
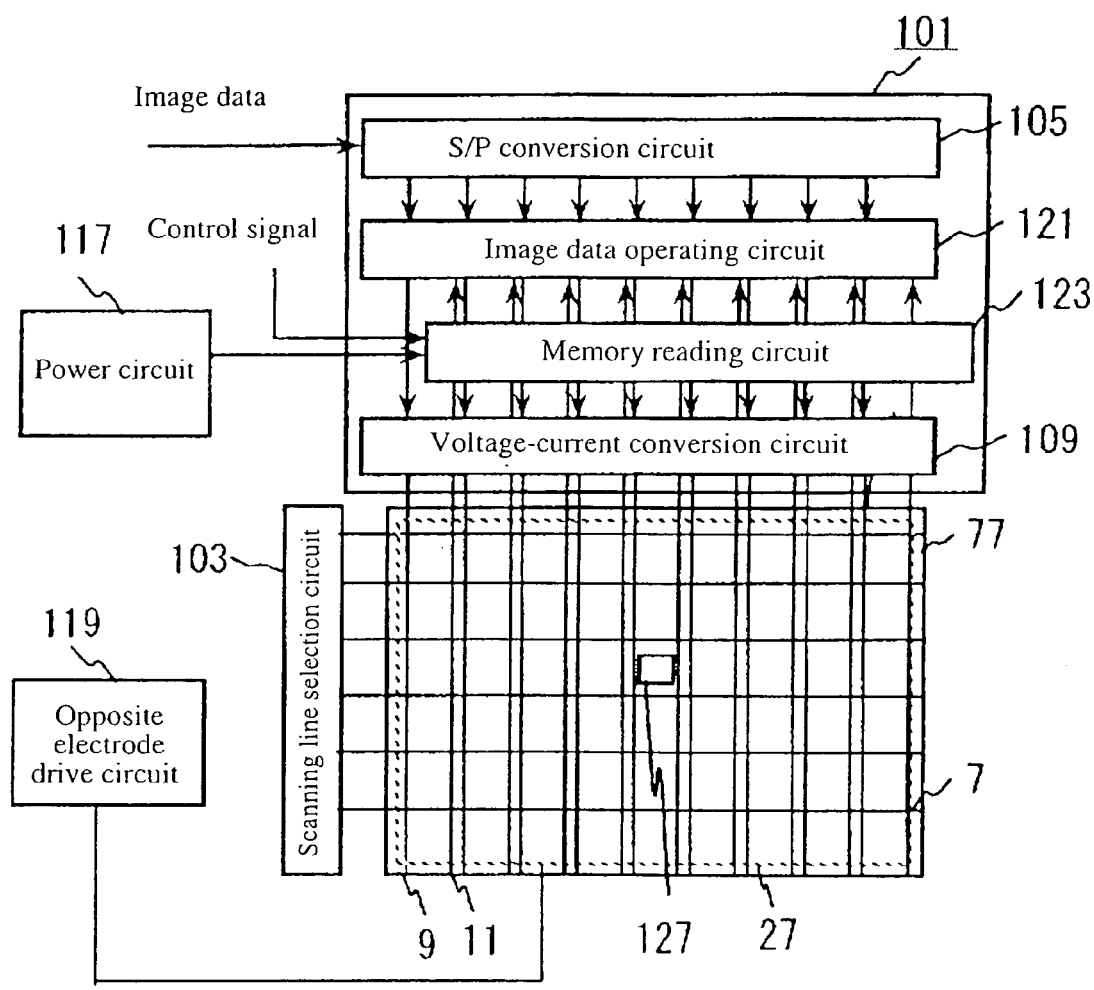
FIG. 13 is a block diagram showing an image display apparatus according to the sixth embodiment of the present invention.

FIG. 13 is a block diagram showing an image display apparatus according to the sixth embodiment of the present invention. The image display apparatus of this embodiment is provided with a memory reading circuit 123 as shown in FIG. 12 and an image data operating circuit 121 in addition to a signal line drive circuit 101 as described in FIG. 7. The image data operating circuit 121 has a line memory corresponding to the line memory 107 of FIG. 7 to retain data from the serial-parallel signal conversion circuit (S/P conversion circuit) 105. The memory reading circuit 123 provided in the signal line drive circuit 101 reads image data stored in a pixel 127 (only one pixel for one line is indicated in FIG. 13) for one line selected by the scanning line selection circuit 103, and the read image data is sent to the image data operating circuit 121.

Further, in the signal line drive circuit 101, the serial-parallel signal conversion circuit 105 converts the image data signals transmitted as serial signals to the same number of parallel signals as the number of signal electrode lines 9, and the image data corresponding to one scanning line is sent to the line memory present in the image data operating circuit 121. The image data operating circuit 121 compares the image data stored in the line memory with the data read from the image memory element in the pixel 127. As a result of the comparison, rewriting data is sent to the voltage-current conversion circuit 109 only when the data are different.

The voltage-current conversion circuit 109 converts the rewriting data from the image data operating circuit 121 to current and outputs the current in timing with a control signal. The scanning line selection circuit 103 selects a scanning electrode line 7 and enables it to have a high level, and sequentially conducts scanning. The power source circuit 117 generates reference voltage of a data signal and voltage to be applied to the scanning electrode line 7 and opposite electrode 27. The opposite electrode drive circuit 119 converts the drive voltage to an alternating current which is applied to the opposite electrode and applies the voltage to the opposite electrode 27.

Figure 14:
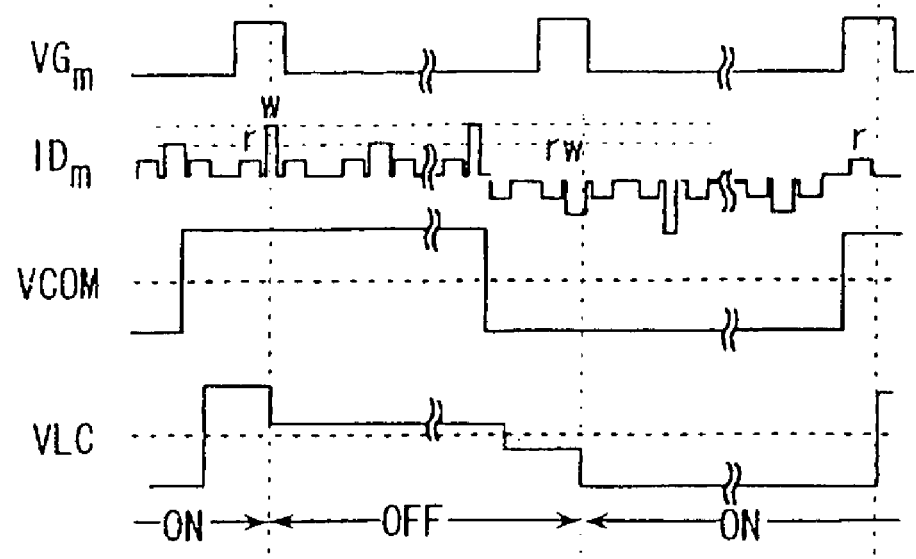
FIG. 14 is an explanatory view showing signal waveforms for driving the image display panel according to the sixth embodiment of the present invention.

FIG. 14 is an explanatory view showing signal waveforms for driving the image display panel according to the sixth embodiment of the present invention. In the figure, reference marks VGm, IDn, r, and w denote voltage to be applied to m-th scanning electrode line 7, current (signal current) flowing through the signal electrode line 9, read current, and write current, respectively. Additionally, VCOM and VLC represent drive voltage for driving the liquid crystal element 5 and voltage to be applied to the liquid crystal element 5, respectively. Voltage VGm of the scanning electrode line 7 is selected once in every one writing cycle by the scanning line selection circuit 103 to have a high level. Current data signals are supplied from the signal line drive circuit 101 to the signal electrode line 9.

In a pixel present at a crossing point of m-th scanning electrode line 7 and n-th signal electrode line 9, when voltage VGm of m-th scanning electrode line 7 becomes high level, the TFT 17 of FIG. 12 is turned on. Therefore, current IDn that has flown through the signal electrode 9 flows through the TFT 17 to be supplied to the image memory element 1. While this selected signal has a high level, a read current "r" and a write current "w" flow. First, the read current "r" flows to read memory information of the image memory element 1. Difference between this memory information and a subsequent image signal retained in the line memory provided in the image data operating circuit 121 is determined. The signal line drive circuit 101 sends the write current to the signal electrode line 9 to switch the image memory element 1 only when the memory information differs from the image signal.

Drive voltage VCOM for driving the liquid crystal element 5 is applied to the opposite electrode 27. In this embodiment, an ac voltage to reverse the polarity once every frame cycle is employed as drive voltage VCOM. FIG. 14 shows a case wherein this one frame cycle is equal to one writing cycle. In the case of displaying an image such as a still image, one frame cycle may be longer than one writing cycle. The polarity of base voltage VGm of the signal electrode line 9 is also reversed at the same time as the drive voltage VCOM, thereby causing the potential between the signal electrode line 9 and the opposite electrode 27 to be small. This causes the current flowing through the liquid crystal element 5 to be small, and enables almost all the current to flow through the image memory element 1. The polarity of signal current IDn is reversed in time with the reversal of the drive voltage VCOM.

With respect to selection period for scanning electrode line 7, a selection period for one scanning line is about 16 μs for an ordinary frame cycle of about 60 Hz and with 1,000 scanning lines. This is substantially longer than the reading and writing periods of the image memory element. Therefore, during the selection period for one scanning line, the reading and writing can be performed.

In this embodiment, the data stored in the pixel can be rewritten with regard only to the pixels different from those in the subsequent image data. Thus, the number of times of rewriting of the image memory element 1 can be reduced. Therefore, even though an image memory element 1 having a short service life for repeating is used, its performance for displaying can be maintained for a long time. Further, since data of an image memory element present in a pixel can be read, it can function as image memory without the provision of a separate image memory. Other effects of this embodiment are the same as those of the above embodiments.

Figure 15:
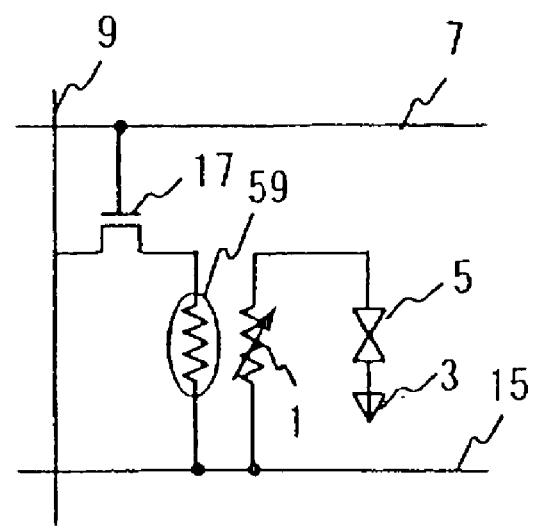
FIG. 15 is a circuit diagram of a pixel part of the liquid crystal display panel constituting the image display apparatus according to a seventh embodiment of the present invention.

FIG. 15 is a circuit diagram of the pixel part of the liquid crystal display panel constituting the image display apparatus according to a seventh embodiment of the present invention. In this embodiment, a heater 59 is provided for rewriting the image memory element 1, and a circuit for switching the image memory element 1 and a circuit for driving the liquid crystal element 5 are separated from each other. The image memory element 1 is connected in series to the liquid crystal element 5 and the heater 59 is installed adjacent to the image memory element 1. The heater 59 is driven by the TFT 17.

In FIG. 15, when a scanning electrode line 7 is selected and has a high level, the TFT 17 conducts and current is applied to the heater 59. The image memory element 1 receives heat from the heater 59 to switch a memory state. The memory state of the image memory element 1 is controlled by controlling the temperature and energizing period of the heater 59. A voltage determined by the division of the voltage to be applied across the reference electrode line 15 and the opposite electrode by the liquid crystal element 5 and the image memory element 1 is applied to the liquid crystal element 5, and thus the display on the liquid crystal element 5 is performed in response to the resistance state of the image memory element 1. According to this embodiment, since the circuit for driving the image memory element 1 and the circuit for driving the liquid crystal element 5 are separated from each other, drive voltage can be always applied to the liquid crystal element 5, thereby simplifying the configuration of the drive circuit.

Figure 16:
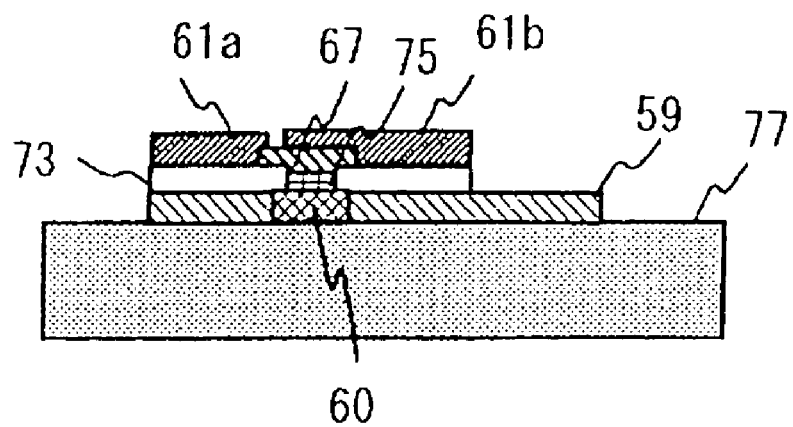
FIG. 16 is a cross-sectional view showing a configuration example of a heater and an image memory element provided in the pixel part of the liquid crystal display panel constituting the image display apparatus according to the seventh embodiment of the present invention.

FIG. 16 is a cross-sectional view showing an example of the configuration of the heater and the image memory element provided in the pixel part of the liquid crystal display panel constituting the image display apparatus according to the seventh embodiment of the present invention. In FIG. 16, a heater electrode 59 is formed on a substrate 77 (because the heater electrode is identical to the heater of FIG. 15, like reference numeral is assigned to both of them). As materials for the heater electrode 59, metals with high melting temperature, such as Ta, MoTa, MoW, W, and Mo may be used. These materials are often used for gate wirings of liquid crystal display apparatuses, and have good consistency with manufacturing process of ordinary liquid crystal display panels. Further, when they are used, TFT gate wirings can be simultaneously formed.

Heat generation can be concentrated by narrowing the width of the heater electrode 59, and a part of the heater electrode 59 is referred to as a heat generation part 60. A highly thermal conductive dielectric film 75 with high thermal transmission ratio, made from aluminum nitride (AlN), silicon nitride (SiN), or the like, is formed on the heat generation part 60. A low thermal conductive dielectric film 73 with low thermal transmission ratio as an insulating film, made from silicon oxide ($SiO_2$), zirconium oxide ($ZrO_2$), or the like, is formed on the remaining part other than the heat generation part. A phase change film 67 is formed on the highly thermal conductive dielectric film 75, and on top of that, one electrode 61a and the other electrode 61b of the image memory element are formed. The other electrode 61b of the image memory element is formed to cover the phase change film 67.

Heat generated at the heat generation part 60 of the heater electrode 59 is conducted mainly through the highly conductive dielectric film 75 to heat the phase change film 67. The heat is conducted from the phase change film 67 to the other electrode 61b of the image memory element, which covers the phase change film 67 and has a high thermal transmission ratio. Since the metal film as the other electrode 61b of the image memory element is formed on the phase change film 67, the other electrode 81b functions as a heat sink film so that a molten phase change film can be rapidly cooled and made amorphous.

A film to function as a heat sink film is not necessarily the other electrode 61b, but other film that is electrically insulated from the phase change film 67 may be usable and a metal with high thermal conductivity is preferably used for the film. Further, since the heat generation part 60 is thermally insulated using the low thermal conductive film 73, heat from the heat generation part 60 is efficiently and intensively conducted from a minute area of the highly thermal conductive dielectric film 75 to a minute area of the phase change film 67. Since the heat capacity of the heated area is small, the phase change film can be rapidly cooled. Since the other electrode 61b of the image memory element is placed away from the heat generation part 60, heat is conducted through the other electrode 61b of the image memory element to be released. Therefore, the other electrode 61b is not necessarily a metal with high melting temperature, and a metal such as aluminum can be used. Silicides such as $TaSi_2$ may be used for the heater electrode 59.

Figure 17:
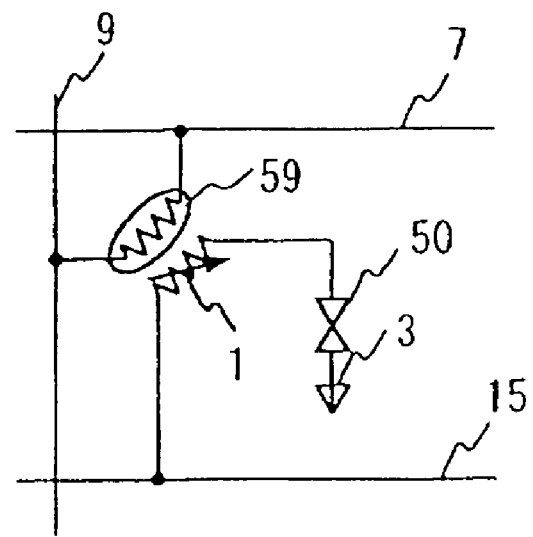
FIG. 17 is a circuit diagram of a pixel part of a liquid crystal display panel constituting an image display apparatus according to an eighth embodiment of the present invention.

FIG. 17 is a circuit diagram of a pixel part of a liquid crystal display panel constituting an image display apparatus according to an eighth embodiment of the present invention. The liquid crystal display panel of this embodiment is a display panel using passive matrix liquid crystal element 50, which is provided with a heater 59 for rewriting an image memory element 1 as described in FIG. 15. The image memory element 1 is connected in series to the liquid crystal element 50 and the heater 59 is installed adjacent to the image memory element 1.

In FIG. 17, when a scanning electrode line 7 is selected and has a high level, current flows from the signal electrode line 9 to the heater 59 so that the heater generates heat. The image memory element 1 receives the heat from the heater 59 to switch a memory state. The memory state of the image memory element 1 is controlled by controlling the temperature and energizing period of the heater 59. Since a voltage determined by the division of the voltage to be applied across the reference electrode line 15 and opposite electrode 3 by the liquid crystal element 50 and image memory element 1 is applied to the liquid crystal element 50, the display on the liquid crystal element 50 is performed in response to the resistance of the image memory element 1.

Although, in this embodiment, the liquid crystal display apparatus utilizes a passive matrix liquid crystal display panel, it has an image memory element. An image to be displayed can be controlled in accordance with a memory state of the image memory element by switching the memory state of the image memory element. An image memory element rewriting means comprising the heater 59 directly connected to the scanning electrode line 7 and the signal electrode line 9 is separated as circuit from the image memory element 1 and the liquid crystal element 50, each of which can be independently driven.

According to this embodiment, it is not necessary to use an active element such as TFT, and therefore image memory elements can be provided in pixels when a very simple configuration of passive matrix type is employed.

Figure 18:
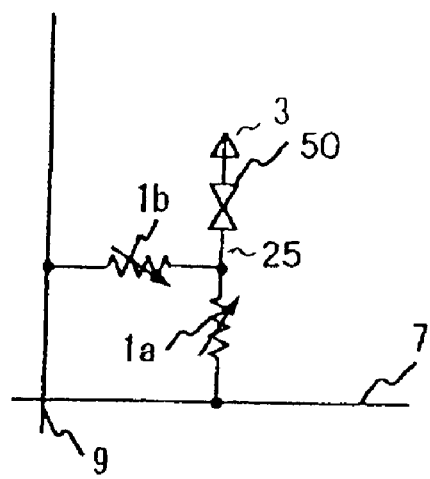
FIG. 18 is a circuit diagram of a pixel part of a liquid crystal display panel constituting an image display apparatus according to a ninth embodiment of the present invention.

FIG. 18 is a circuit diagram of a pixel part of a liquid crystal display panel constituting an image display apparatus according to a ninth embodiment of the present invention. The liquid crystal display panel of this embodiment utilizes a passive matrix liquid crystal element 50 in the same manner as the embodiment described in FIG. 17. One terminal of a first image memory element 1a is connected to the scanning electrode line 7, one terminal of a second image memory element 1b is connected to the signal electrode line 9, and the other terminals of first and second image memory elements 1a and 1b are connected to an element electrode 25 of the liquid crystal element 50.

In this embodiment, first, all the elements of the image display panel are scanned and image data is written. In the case of writing image data, a scanning electrode line 7 is selected and has low impedance. When the scanning electrode line 7 has low impedance, current flows from the signal electrode line 9 to the first and second image memory elements 1a and 1b to switch their memory states. Since a current with the same value passes through the first and second image memory elements 1a and 1b, both have memory states with the same resistance. After image data is written in all the elements 50, both scanning electrode line 7 and signal electrode line 9 are made to be at the same potential so as to have reference voltage. A voltage determined by the division of the reference voltage and the difference voltage across opposite electrodes by the liquid crystal element 50, and the first and second image memory elements 1a and 1b is applied to the liquid crystal element 50. The liquid crystal element 5 is driven in accordance with resistance states of the first and second image memory elements 1a, 1b to perform the display.

In this embodiment, data writing to pixels and displaying are temporally separated. This embodiment is suitable for an image display apparatus, which displays the same image data for a long period. Further, the first and second image memory elements 1a and 1b are nonvolatile, and the use of these nonvolatile memories enables the retention of image data when the power is turned off. Hence, image data can be retained for a long period.

Further, in this embodiment, the first and second image memory elements 1a, 1b are connected in parallel to the liquid crystal element 50. Thus, when there are variations in resistance of both memory elements, they are averaged to reduce display variations. Furthermore, image data can be stored without the use of transistor elements such as TFT, resulting in a simple pixel configuration. In particular, electrodes connected to the phase change film and liquid crystal element 50, which are used as the first and second memory elements 1a and 1b, can be formed using a film having the same layer. Also, the phase change film is not necessarily electrically insulated. Therefore, two memory elements can be easily manufactured without the need for processing by etching, etc.

Figure 19:
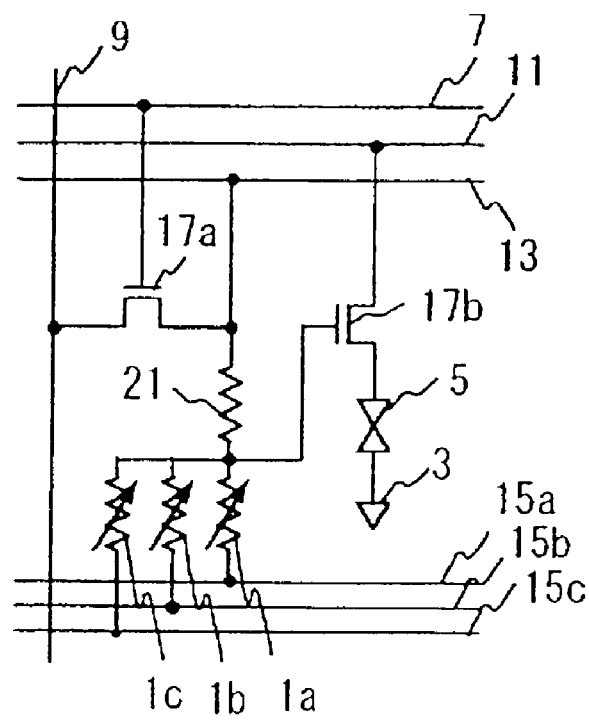
FIG. 19 is a circuit diagram of a pixel potion of a liquid crystal display panel constituting an image display apparatus according to a tenth embodiment of the present invention.
Figure 20:
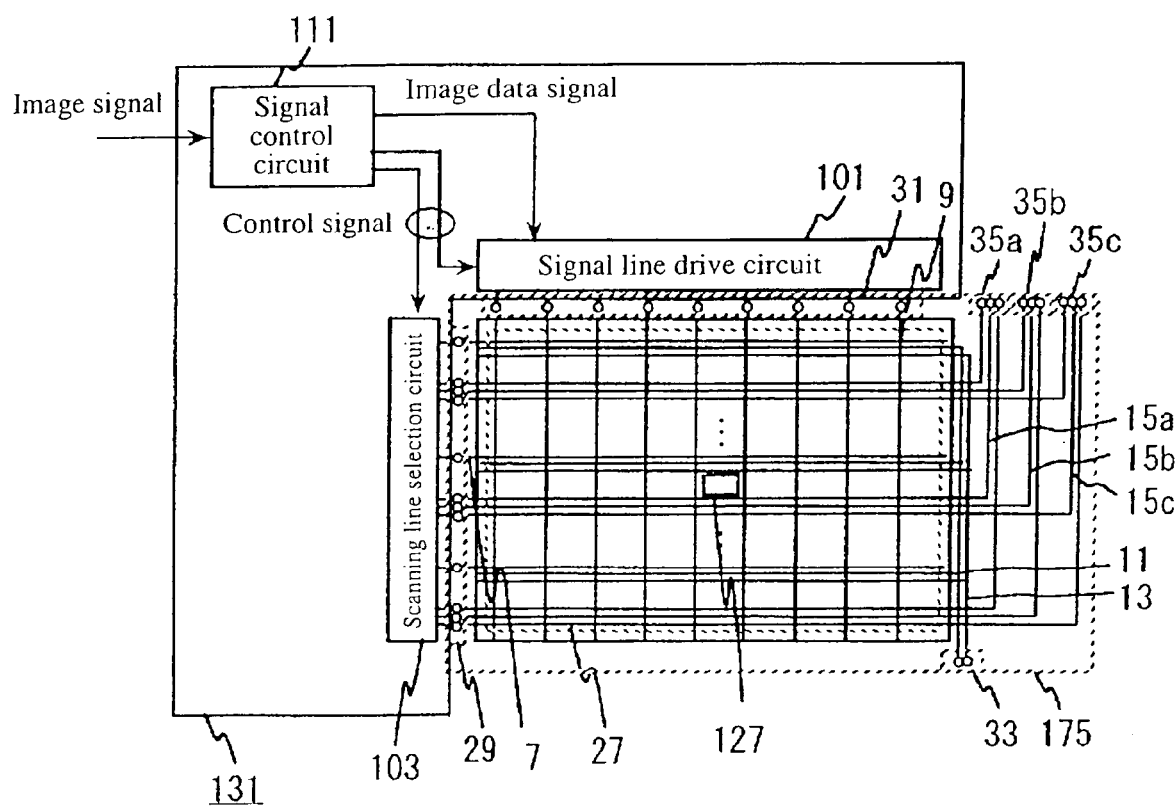
FIG. 20 is a block diagram showing that image data is written in an image display module configured by connecting a liquid crystal display panel having the pixel structure shown in FIG. 19 to a recording apparatus.
Figure 21:
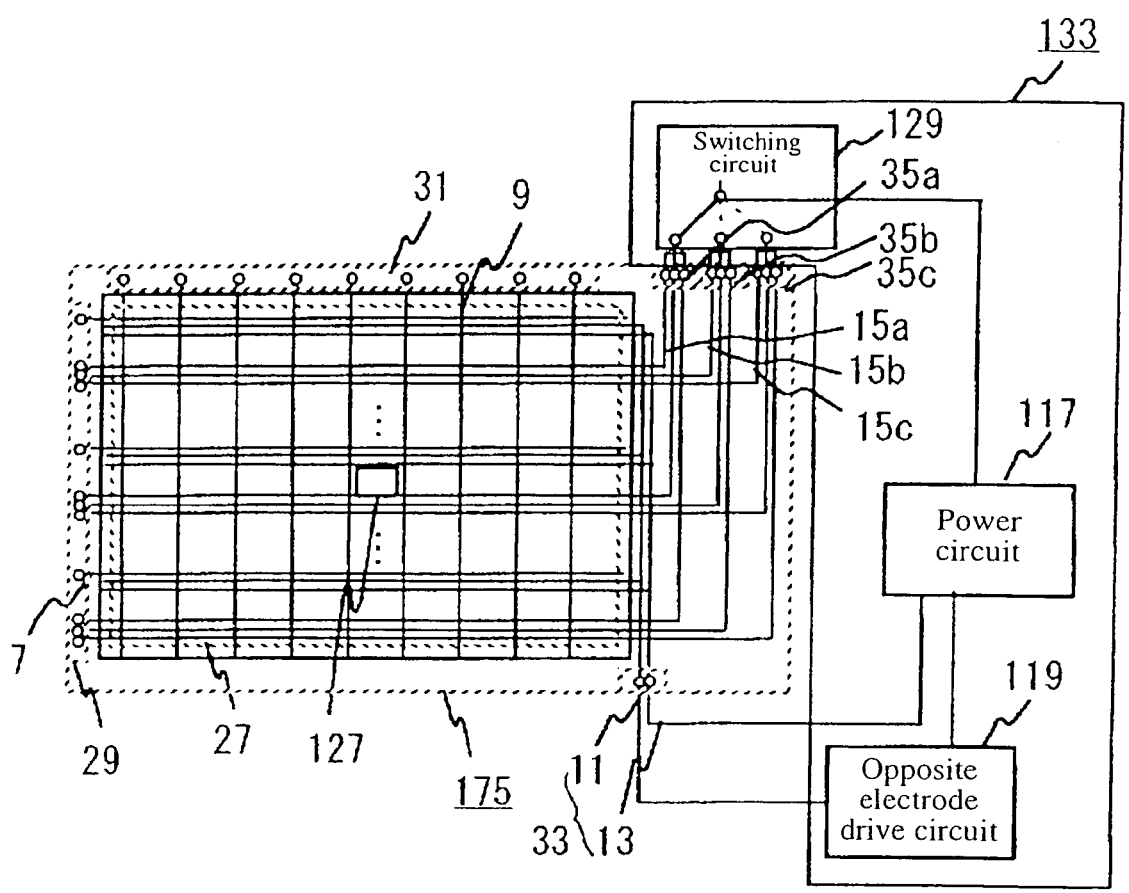
FIG. 21 is a block diagram showing that image data is displayed with the image display module configured by connecting the liquid crystal display panel having the pixel structure shown in FIG. 19 to a display drive apparatus.

FIG. 19 is a circuit diagram of a pixel part of a liquid crystal display panel constituting an image display apparatus according to a tenth embodiment of the present invention. FIG. 20 is a block diagram showing that image data is written in an image display module configured by connecting a liquid crystal display panel having the pixel structure shown in FIG. 19 to a recording apparatus. FIG. 21 is a block diagram showing that image data is displayed with the image display module configured by connecting the liquid crystal display panel having the pixel structure shown in FIG. 19 to a display drive apparatus.

The liquid crystal panel of this embodiment has three image memory elements in one pixel as shown in FIG. 19. The one pixel has first and second TFTs 17a and 17b connected to a liquid crystal element 5, wherein one end of each of first, second, and third image memory elements 1a, 1b, and 1c are connected in common therewith. The other ends of image memory elements 1a, 1b, and 1c are connected to first, second, and third reference electrode lines 15a, 15b, and 15c, respectively.

This liquid crystal display panel 175 comprises a scanning line connection pad 29, a signal line connection pad 31, a power source line connection pad 33, selection line connection pads 35a, 35b, and 35c, and is configured to be detachable from a recording apparatus 131 having the signal line drive circuit 101, the scanning line drive circuit 103, and a power source with these connection pads. The recording apparatus 131 is provided with the signal line drive circuit 101, the scanning line drive circuit 103, a power source (not shown), and a signal control circuit 111.

Namely, an image display module as shown in FIG. 20 or as shown in FIG. 21 is configured by connecting the recording apparatus 131 or the display drive apparatus 133 to the liquid crystal panel 175. In this way, image data recording operation on the liquid crystal display panel 175 and displaying operation of the recorded image data can be independently performed by selectively connecting the image display panel 175 to the recording apparatus or display drive apparatus. Hereinafter, operations of the image display module having the above configuration will be described using FIG. 19.

First, in writing image data into pixels of the liquid crystal display panel 175 in FIG. 20, the liquid crystal display panel 175 is connected to the recording apparatus 131 via the scanning line connection pad 29 and the signal line connection pad 31. When a scanning electrode 7 is selected and has a high level by the scanning line selection circuit 103, the first TFT 17a is turned on by a image data signal from the signal control circuit 111 whereby an image signal from an external signal source is inputted, and a timing control signal such as clock. In the writing operation of image data into the liquid crystal display panel 175, it is not necessary that voltage is applied to the power electrode line 13 and the power electrode line 13 has high impedance. Therefore, current flows through the resistor 21, and never flows toward the power electrode line 13. The first TFT 17a is connected to the first, second, and third image memory elements 1a, 1b, and 1c via the resistor 21.

The selection period of the scanning electrode line 7 is divided by the number of memory elements, that is by three in this embodiment, and the first, second, and third reference electrode lines 15a, 15b, and 15c are sequentially selected by the scanning line selection circuit 103. When the first reference electrode line 15a is selected, a current data signal, which is an image data signal, passes through the first image memory element 1a by allowing the second and third reference electrodes 15b and 15c to have high impedance, and then the first memory element 1a is set to a desired state. Subsequently, different image data is written into the second and third image memory elements 1b and 1c.

When the written image data is displayed, the first, second, and third reference electrode lines 15a, 15b, and 15c of the liquid crystal display panel 175 are connected, as shown in FIG. 21, to the display drive circuit 133 via the selection line connection pads 35a, 35b, and 35c. The selection connection pads 35a, 35b, and 35c are connected to a switching circuit 129, and the power source line connection pad 33 is connected to a drive voltage supply electrode line 11 from the liquid crystal display circuit 119 and the power source electrode line 13 from the power source circuit 117. At this time, the recording apparatus 131 shown in FIG. 20 may be removed from the liquid crystal display panel 175. DC voltage from the power source circuit 117 is applied on the power source electrode line 13 via the power source line connection pad 33 and AC voltage from the liquid crystal drive circuit 119 is applied to the drive voltage supply electrode.

The switching circuit 129 selects from the first, second, and third reference electrode lines 15a, 15b, and 15c. When the switching circuit 129 selects the first reference electrode line 15a, DC voltage from the power source electrode line 13 is applied to the resistor 21 and the image memory element 1a of FIG. 19. Then, depending on the resistance value of the first image memory element 1a, voltage to be applied to the gate of the second TFT 17b varies, whereby the second TFT 17b is turned on or off. When the second TFT 17b is turned on, voltage of the drive voltage supply electrode line 11 is applied to the liquid crystal element 5. When the second TFT 17b is turned off, no voltage is applied to the liquid crystal element 5, thereby switching a display state of the liquid crystal element 5.

Next, the switching circuit 129 switches to the second reference electrode line 15b, and an image is displayed based on the image data recorded in the second image memory element 1b. In the same way, when the switching circuit 129 switches to the third reference electrode line 15c, an image is displayed based on the image data recorded in the third image memory element 1c. Since three memory elements are provided in the pixel in this embodiment, three types of images can be displayed by switching. However, when the number of image memory elements is increased, more images can be displayed by switching.

As described above, the image display panel 175 of this embodiment has a nonvolatile memory in the pixels thereof.

Once image data is recorded, the image data recorded in the nonvolatile memory of the pixel can be displayed by supplying only drive voltage, even without an external memory. Hence, the recording apparatus 131 is not necessary for displaying image data as described above.

In this way, a plurality of images can be switched and displayed without external supply of image data by installing a plurality of memory elements in one pixel, and switching and displaying image memory elements. Therefore, when the image display apparatus of this embodiment is used for posters, hanging posters, signboards, or the like, the use of only the image display panel 175 and display drive apparatus 133 enables a moving display. Since this image display panel 175 has the image memory element, the content of which can be rewritten, it can be repeatedly used by rewriting image data.

In this way, by connecting the recording apparatus 131 to the image display panel 175 to record images, it is possible to write image data into a plurality of display modules 175 using the same recording apparatus 131. The presence of the display drive apparatus 133 to supply voltage is enough for displaying image data, and an image display apparatus capable of displaying various images at low cost is prepared. Further, it is possible to increase the number of images to be displayed by increasing the number of image memory elements in one pixel. Furthermore, the display drive apparatus 133 may be an image display apparatus integral with the image display panel 175.

While in this embodiment, a liquid crystal element is used as the image display element, this is only exemplary and similar display can be provided using various display panels such as electroluminescence panels using organic light-emitting elements.

Figure 22:
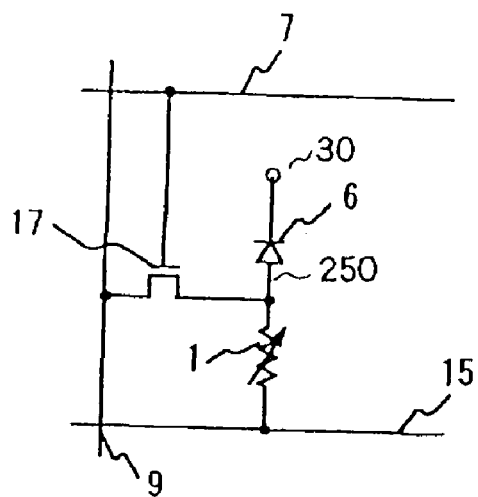
FIG. 22 is a circuit diagram showing the configuration of one pixel of a pixel part in a display panel according to an eleventh embodiment of the present invention.

FIG. 22 is a circuit diagram showing the configuration of one pixel of a pixel part in a display panel according to an eleventh embodiment of the present invention. In this embodiment, an organic electroluminescence display element (OLED) 6 is used as an image display element. An image memory element 1 to store image data is provided in one pixel, and it stores data to be displayed on the pixel of the OLED element 6. In this embodiment, this image memory element 1 can also reversibly change resistance values to record and rewrite data in the same manner as those described in the above embodiments. It is a nonvolatile memory, from which recorded data cannot be erased during ordinary use.

This image memory element 1 is switched by applying a pulse current from a signal electrode line 9, and the resistance state to be switched is controlled by changing the current value and pulse width of the pulse current. When a scanning electrode line 7 is selected and has a high level, the TFT 17 is turned on. A data current signal sent to the signal electrode line 9 at this time is captured into the TFT 17 and it is sent to the reference electrode 15 through the image memory element 1. Depending on the value or pulse width of current flowing through the image memory element 1, the resistance of the image memory element 1 varies and the storage is performed.

As shown in this embodiment, when a current to drive the OLED element 6 flows from the reference electrode line 15 through the OLED element 6 toward the opposite electrode, the signal electrode line 9 has a low potential relative to the reference electrode line 15 and has reverse voltage relative to the OLED element 6. The image memory element 1 is thereby switched without the flow of pulse current from the signal electrode line 9 to the OLED element 6. A pixel electrode 250 at one side of the OLED element 6 is connected to the reference electrode line 15 via the image memory element 1. When the image memory element 1 is in a low resistance state, a current flows by way of a drive voltage applied across the opposite electrode 30 of the OLED element 6 and the reference electrode line 15 and the light-emission and the display can be performed. Further, when the image memory element 1 is in a high resistance state, a current flowing in the OLED element 6 does not become greater than the threshold, and the OLED element 6 is turned off. A drive current of this OLED element 6 is not greater than the threshold current $I_{th}$, which can change the state of the image memory element 1, and the state of the image memory element 1 cannot be changed by way of drive current of the OLED element 6.

In this embodiment, the resistance value of the image memory element 1 can be continuously changed by controlling the current value applied to the image memory element 1 within the range from $I_{reset}$ to $I_{th}$, and thereby gradation display on the OLED element 6 is possible.

Further, in this embodiment, the OLED element 6 can be controlled by only one TFT 17, and gradation display is also possible. Furthermore, the image memory element can be configured without the use of a storage capacitor used for an ordinary OLED element, thereby simplifying a pixel configuration. Moreover, the image memory element 1 is nonvolatile. Therefore, when the same image is displayed, refreshing the image memory element 1 is not needed and rewriting frequency can be reduced, thereby enabling low power consumption.

Figure 23:
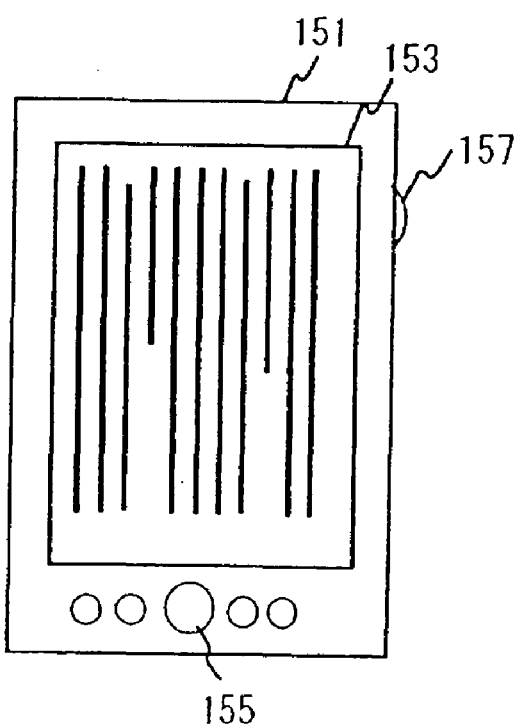
FIG. 23 is a plane view showing one example of an electronic instrument carrying an image display apparatus of the present invention.
Figure 24:
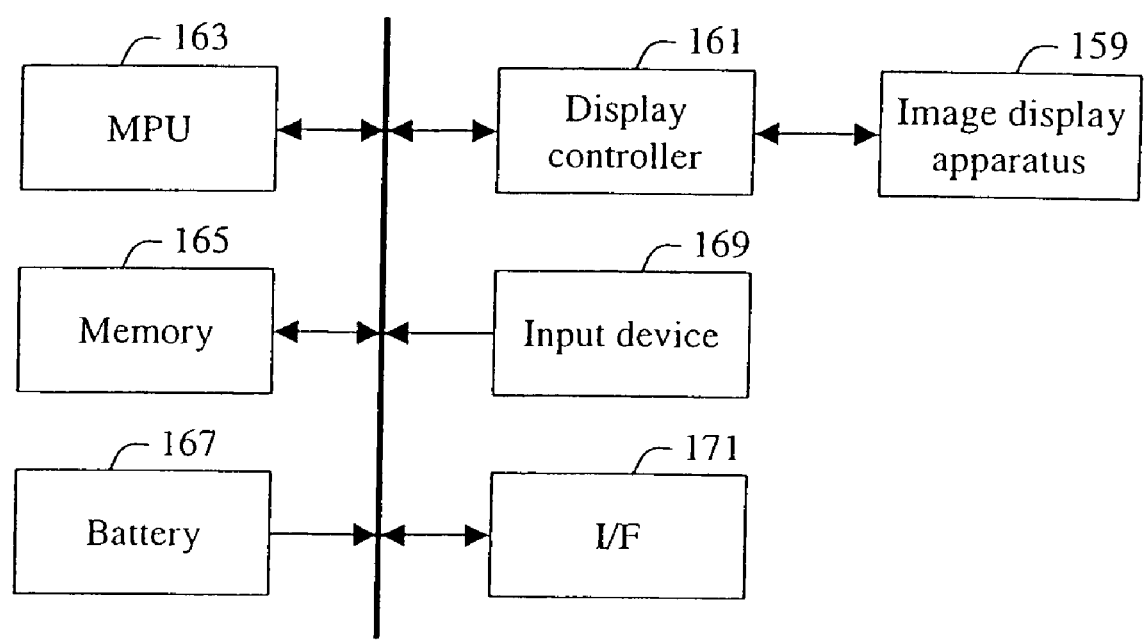
FIG. 24 is a system configuration diagram of the electronic instrument shown in FIG. 23.

FIG. 23 is a plane view showing one example of an electronic instrument carrying an image display apparatus of the present invention. FIG. 24 is a system configuration diagram of the electronic instrument shown in FIG. 23. This electronic instrument is called an electronic book as a portable instrument (PDA). This electronic instrument has functions to download and utilize data (contents) of books, for example, novels, via lines such as the Internet or from an external data source such as a PC. An image display apparatus of the present invention is installed on a display part 153 of an electronic book 151. An input key 155 and an input dial 157 are provided on a part of the main body of the electronic book.

The system of an electronic book 151 comprises, as shown in FIG. 24, an image display apparatus 159, a display controller 161, a microprocessor (MPU) 163, a memory 165, a power source (battery) 167, an input device 169, and an interface (I/F) 171, which are connected to a system bus 175. Display data in the memory 165 is processed by the MPU 163 via the system bus 175 and sent to the display controller 161. The display controller 161 controls the display apparatus 159 to visibly display the data in the memory 165 on the display part 153. Pixels of a display panel of the image display apparatus constituting the display part 153 have nonvolatile memories.

As described in the above embodiments, this nonvolatile memory can be used as an image memory and the contents stored in the image memory may be read. Operations such as turning pages on the display part 153 or choosing a book to be displayed are performed by operating the input device 169 such as the input dial 157 or input key 155. Data of books or the like is loaded into the memory 165 from the external data source via the interface 171.

Image memory elements existing in the display panel constituting the image display apparatus of the present invention can be formed in minute scales and allow a pixel to have a large aperture ratio, and thus they are suitable for displaying high-definition images. In particular, once an image of a content is displayed based on characters/still pictures such as that of newspapers, books, or cartoons, the same image is continuously displayed until the reading is finished. For such an image, high-definition display is available and the frame frequency can be reduced. Therefore, the image display apparatus produces a significant effect of low power consumption and is suitable for an electronic instrument of this type. In other words, it is necessary only to drive the image display part until the displayed image is to be rewritten, thereby enabling low power consumption. Further, when a liquid crystal display apparatus is used, a nonvolatile memory is used therein. Thus, the frame frequency can be reduced to such degree that the liquid crystal element does not deteriorate, further enabling low power consumption. Moreover, it is preferable to employ a reflection image display apparatus, which does not theoretically require a supplementary illumination light source in terms of low power consumption. Further, when a liquid crystal display apparatus is used as an image display apparatus, it is possible to display a color image using a color filter as usual.

The image display apparatus of the present invention is not limited to the above-described portable electronic instrument, and needless to say, the present invention is applicable to other image display instruments.

EFFECT OF THE INVENTION

As described above, the present invention provides an image display apparatus, which has a simple configuration of its display panel having a function to store displayed data, enhance the aperture ratio, operate with low power consumption, and retain image data in a pixel even in the absence of power supply by providing a nonvolatile memory based on resistance variations inside the pixel.

All publications, patents and patent applications cited herein are incorporated herein by reference in their entirety.

What is claimed is:

1. An image display apparatus comprising:
an image display panel having a display element comprising a plurality of pixels arranged in a matrix at crossing points where a plurality of scanning electrode lines cross a plurality of signal electrode lines;
a scanning electrode line selection circuit for selecting the scanning electrode lines of the image display panel;
a signal electrode line drive circuit for driving the signal electrode line;
storage means for storing display data for each pixel, said storage means comprising:
memory element electrode,
a phase change film in contact with the memory element electrode, and
a resistor connected to each pixel; and
a switching element for controlling the display state of the display element provided for the pixel, said switching element being a TFT including a gate electrode,
wherein:
the display data is stored in the pixel by way of the resistance value of the resistor,
the storage means is a non-volatile memory,
storage means is capable of rewriting the stored display data in a nonvolatile manner such that the stored display data does not change in the absence of power,
the display state of the display element is controlled by controlling the switching element using a voltage that changes in accordance with the resistance value of the storage means,
the switching element is turned on/off based on changes in the resistance value of the storage means, and
the gate electrode and the memory element electrode have higher melting points than the phase change film.

2. The image display apparatus according to claim 1, further comprising means for reading the display data stored in the storage means.

3. The image display apparatus according to claim 2, further comprising:
an operating means for comparing the display data read from the storage means by the reading means with display data to be subsequently displayed,
wherein:
the read display data is compared with the display data to be subsequently displayed and the storage means is rewritten with the display data to be subsequently displayed only when the display data are different,
the storage means is provided within the pixel,
the operating means is provided outside of the image display panel,
the operating means includes a line memory for storing one scanning line of image data, and
the line memory holds display data read from the storage means by the reading means.

4. The image display apparatus according to claim 2, wherein each pixel has a plurality of the storage means, the apparatus further comprising means for selecting the storage means.

5. The image display apparatus according to claim 1, further comprising:
a resistor,
wherein a voltage determined by resistive division by the storage means and the resistor is applied to the switching element.

6. The image display apparatus according to claim 1, wherein the gate electrode and the memory element electrode are formed with identical material.

7. The image display apparatus according to claim 1, wherein the TFT includes a source electrode,
wherein the source electrode is formed on the phase change film, and
wherein the width of the phase change film at the side of the memory element electrode is narrower than the width of the phase change film at the side of the source electrode.

8. The image display apparatus according to claim 1, wherein the image display panel includes a recording apparatus that records display data, and the recording apparatus is configured to be detachable.

* * * * *